(12) United States Patent
Weyers et al.

(10) Patent No.: US 12,510,420 B2
(45) Date of Patent: Dec. 30, 2025

(54) SEMICONDUCTOR DEVICE WITH SENSE ELEMENT

(71) Applicant: Infineon Technologies AG, Neubiberg (DE)

(72) Inventors: Joachim Weyers, Höhenkirchen (DE); Franz Hirler, Isen (DE)

(73) Assignee: Infineon Technologies AG, Neubiberg (DE)

( * ) Notice: Subject to any disclaimer, the term of this patent is extended or adjusted under 35 U.S.C. 154(b) by 555 days.

(21) Appl. No.: 17/969,920

(22) Filed: Oct. 20, 2022

(65) Prior Publication Data

US 2023/0127508 A1 Apr. 27, 2023

(30) Foreign Application Priority Data

Oct. 22, 2021 (EP) .................................... 21204313

(51) Int. Cl.
*G01K 7/01* (2006.01)
*H10D 62/10* (2025.01)
*H10D 84/60* (2025.01)

(52) U.S. Cl.
CPC ............. *G01K 7/01* (2013.01); *H10D 62/114* (2025.01); *H10D 84/617* (2025.01)

(58) Field of Classification Search
CPC ...... G01K 7/01; H10D 62/114; H10D 84/617; H10D 30/668; H10D 30/669; H10D 62/127; H10D 84/143; H10D 84/146
See application file for complete search history.

(56) References Cited

U.S. PATENT DOCUMENTS

| 2012/0132867 | A1* | 5/2012 | Boardman ................. C23C 8/10 |
| | | | 252/512 |
| 2014/0001472 | A1 | 1/2014 | Furukawa et al. |
| 2016/0365294 | A1 | 12/2016 | Morl |
| 2018/0301553 | A1 | 10/2018 | Weyers et al. |
| 2019/0371820 | A1 | 12/2019 | Yaginuma |
| 2019/0393334 | A1* | 12/2019 | Weyers ................... H01L 23/36 |

FOREIGN PATENT DOCUMENTS

DE 102018115326 B3 1/2020

* cited by examiner

*Primary Examiner* — Mohammad A Rahman
(74) *Attorney, Agent, or Firm* — Murphy, Bilak & Homiller, PLLC

(57) ABSTRACT

A semiconductor device includes a transistor array and a sense pad. The transistor array includes a plurality of transistor cells electrically connected in parallel between a source electrode and a drain structure. The drain structure is formed in a semiconductor portion based on a single-crystalline wide bandgap material. A sense element formed from the wide bandgap material includes at least one rectifying junction electrically connected between the sense pad and the source electrode.

21 Claims, 15 Drawing Sheets

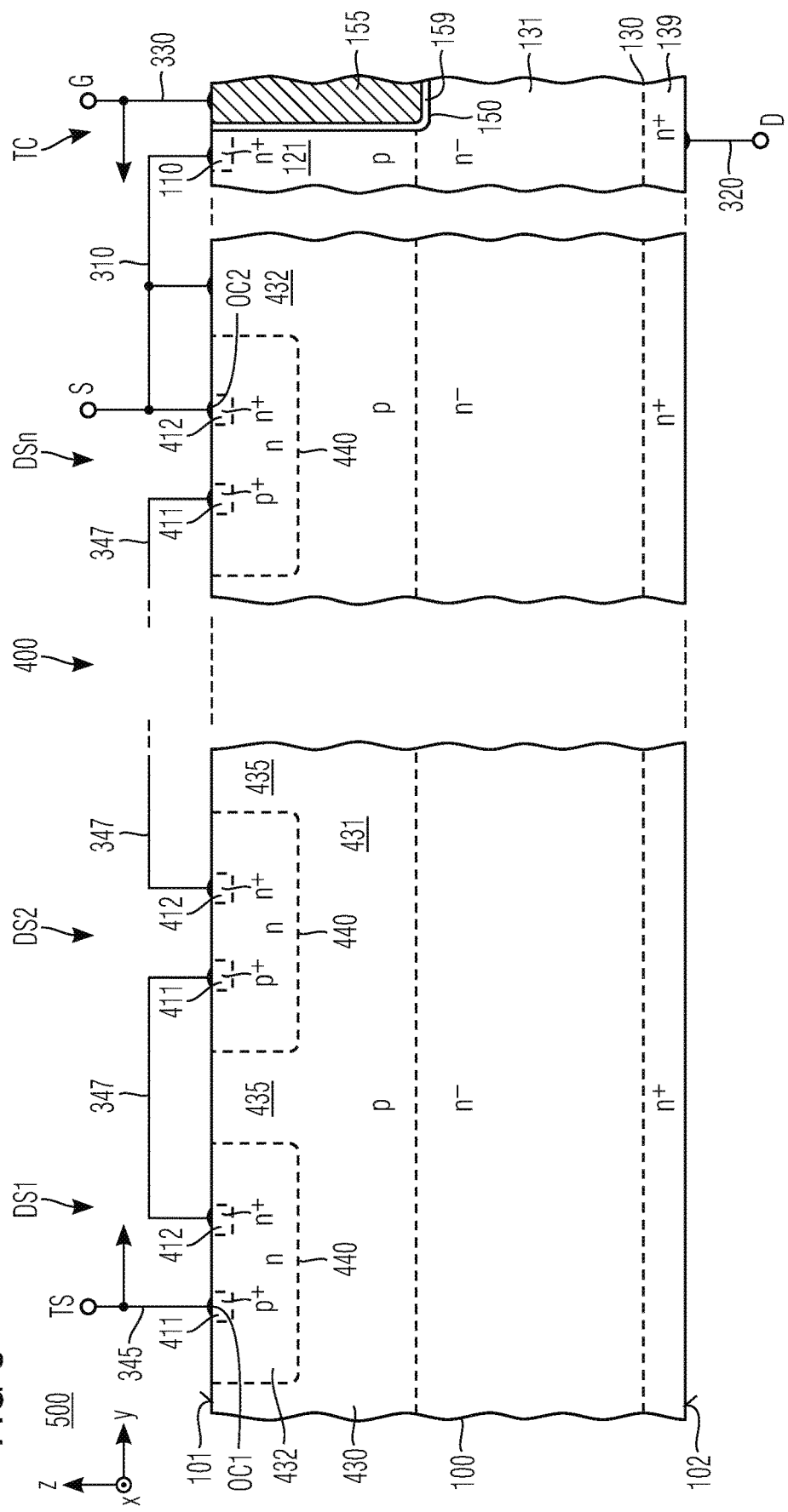

SEMICONDUCTOR DEVICE WITH SENSE ELEMENT

TECHNICAL FIELD

Examples of the present disclosure relate to a wide bandgap semiconductor device with a sense element. In particular, the present disclosure concerns temperature measurement in power semiconductor devices.

BACKGROUND

Continuous condition monitoring of power semiconductor devices can potentially reduce failure rates and alleviate reliability concerns by providing real-time information on the state of health of the power semiconductor devices. In particular, the measurement or estimation of the junction temperature during the operation of the power semiconductor device delivers essential information for its condition. Optical methods using optical fibers and infrared thermal imaging can provide an accurate spatial temperature map of a power semiconductor device. The junction temperature may also be estimated by the measurement of temperature sensitive electric parameters of the power semiconductor device such as dI/dt during turn-on, dV/dt during turn-off, on-state voltage drop, internal gate resistance, threshold voltage and others.

The continuing demand for failure-safe systems is driving the need for estimating the junction temperature more precisely.

SUMMARY

Embodiments of the present disclosure enable monitoring the junction temperature with high precision, little additional effort and little loss of active chip area.

To this purpose, an embodiment of the present disclosure relates to a semiconductor device including a transistor array and a sense pad. The transistor array includes a plurality of transistor cells electrically connected in parallel between a source electrode and a drain structure, wherein the drain structure is formed in a semiconductor portion based on a wide bandgap material. A sense element formed from the wide bandgap material includes at least one rectifying junction electrically connected between the sense pad and the source electrode.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the embodiments and are incorporated in and constitute a part of this specification. The drawings illustrate embodiments of a semiconductor device and together with the description serve to explain principles of the embodiments. Further embodiments are described in the following detailed description and the claims. Features of the various illustrated embodiments may be combined with each other. The drawings are not scaled and are for illustrative purposes only. Corresponding elements are designated by the same reference signs in the different drawings if not stated otherwise.

FIG. 5 shows a schematic vertical cross sectional view of a portion of a semiconductor device with a sense element including four pn junctions according to an embodiment concerning a MOSFET.

DETAILED DESCRIPTION

Figure 1A:
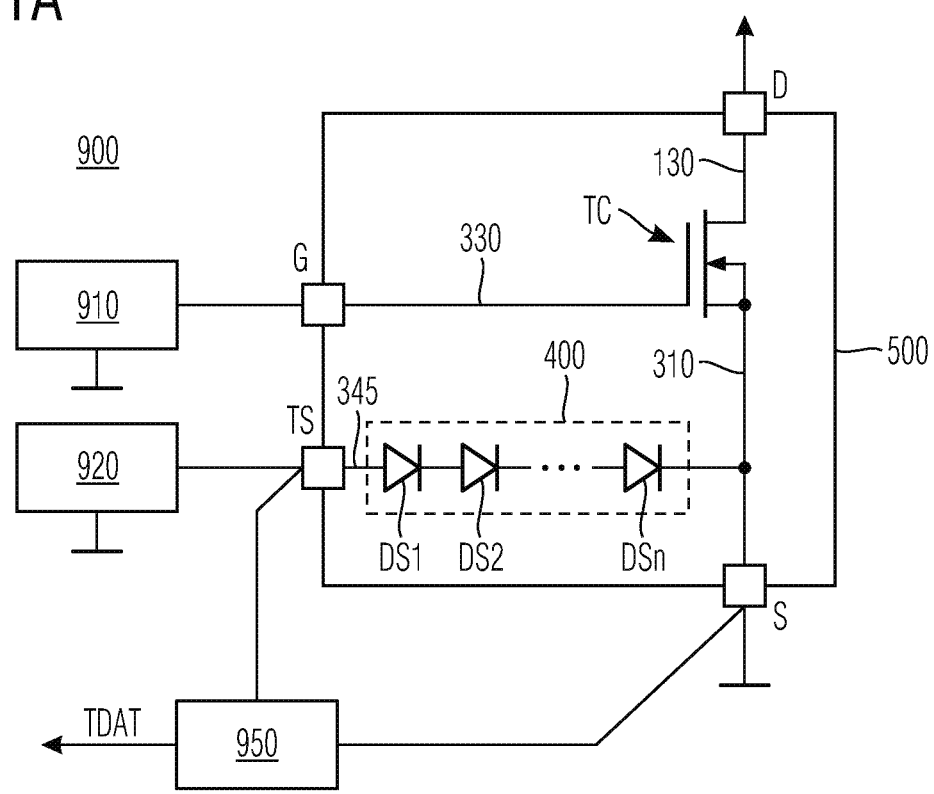
FIGS. 1A and 1B are simplified schematic block diagrams of electronic assemblies for monitoring the temperature in a wide bandgap semiconductor device with a sense element and a sense pad according to an embodiment.

In the following detailed description, reference is made to the accompanying drawings, which form a part hereof and in which are shown by way of illustrations specific embodiments in which a semiconductor device may be practiced. It is to be understood that other embodiments may be utilized and structural or logical changes may be made without departing from the scope of the present disclosure. For example, features illustrated or described for one embodiment can be used on or in conjunction with other embodiments to yield yet a further embodiment. It is intended that the present disclosure includes such modifications and variations. The examples are described using specific language, which should not be construed as limiting the scope of the appending claims.

The terms "having", "containing", "including", "comprising" and the like are open, and the terms indicate the presence of stated structures, elements or features but do not preclude the presence of additional elements or features. The articles "a", "an" and "the" are intended to include the plural as well as the singular, unless the context clearly indicates otherwise.

The term "electrically connected" describes a permanent low-resistive ohmic connection between electrically connected elements, for example a direct contact between the concerned elements or a low-resistive connection via a metal and/or heavily doped semiconductor material.

A rectifying junction is a junction in a semiconductor device that exhibits asymmetrical conductance. Rectifying junctions include rectifying semiconductor-semiconductor junctions (pn junctions) and rectifying metal-semiconductor junctions (Schottky contacts).

An "ohmic contact" is a non-rectifying electrical junction with a linear or almost linear current-voltage characteristic.

Ranges given for physical dimensions include the boundary values. For example, a range for a parameter y from a to b reads as a≤y≤b. The same holds for ranges with one boundary value like "at most" and "at least".

The term "on" is not to be construed as meaning only "directly on". Rather, if one element is positioned "on" another element (e.g., a layer is "on" another layer or "on" a substrate), a further component (e.g., a further layer) may be positioned between the two elements (e.g., a further layer may be positioned between a layer and a substrate if the layer is "on" said substrate).

Two adjoining doping regions in a semiconductor portion form a semiconductor junction. Two adjoining doping regions of the same conductivity type and with different dopant concentrations form a unipolar junction, e.g., an n/n+ or p/p+ junction along a boundary surface between the two doping regions. At the unipolar junction a dopant concentration profile orthogonal to the unipolar junction may show a step or a turning point, at which the dopant concentration profile changes from being concave to convex, or vice versa. Two adjoining doping regions of complementary conductivity form a pn junction.

According to an embodiment, a semiconductor device may include a transistor array and a sense pad. The transistor array includes a plurality of transistor cells electrically connected in parallel between a source electrode and a drain structure, wherein the drain structure is formed in a semiconductor portion based on a wide bandgap material. A sense element formed from the wide bandgap material includes at least one rectifying junction electrically connected between the sense pad and the source electrode.

The semiconductor portion may have two essentially parallel main surfaces, which may have approximately the same shape and size. The semiconductor portion has a surface extension along two horizontal directions and has a thickness along a vertical direction perpendicular to the horizontal directions. In the following, the horizontal directions are also referred to as lateral directions, the main surface at the front side is referred to as first surface and the main surface at the side opposite to the front side is referred to as second surface. A lateral outer surface connects the edge of the first surface with the edge of the second surface.

The semiconductor portion includes a semiconducting part, wherein the semiconducting part may be formed from a single-crystalline wide bandgap semiconductor. The wide bandgap semiconductor has a bandgap greater than that of silicon, e.g. greater than 1.2 eV such as gallium arsenide (GaAs) or greater than 3 eV. For example, the wide bandgap semiconductor may be gallium nitride (GaN) or silicon carbide (SiC), e.g., silicon carbide of a hexagonal polytype, e.g. the 4H polytype. In addition to the semiconducting part, the semiconductor portion may include functional structures from other materials like polycrystalline silicon, dielectrics, elemental metals, metal compounds and/or metal alloys. The functional structures may be formed in trenches extending from the first and/or second surface into the wide bandgap semiconductor portion and/or may be formed on the first surface and/or on the second surface.

The semiconductor device may be a power semiconductor switch controllable through a gate signal applied through a gate pad. In particular, the semiconductor device may be a power MOSFET (metal oxide semiconductor field effect transistor) or an IGBT (insulated gate bipolar transistor).

The transistor array may include stripe-shaped transistor cells, wherein lateral longitudinal axes of the stripe-shaped transistor cells extend parallel to a horizontal direction. Alternatively, the transistor array may include transistor cells arranged in rows and columns.

The transistor cells may be field effect transistor cells, wherein a potential applied to a gate electrode controls by field effect the charge carrier flow through the transistor cell between the source electrode and the drain structure. The transistor cells may be enhancement type transistor cells or depletion type transistor cells, may be normally-on or normally-off and may form an electron channel (n-channel) or a hole channel (p-channel). The following description focusses on normally-off, n-channel transistor cells of the enhancement type.

In particular, each transistor cell may include a source region and a body region. The source region and the drain structure have a first conductivity type. The body region has the complementary second conductivity type and separates the source region and the drain structure from each other. The body region and the drain structure form a first pn junction. The body region and the source region form a second pn junction. The source region and the body region may be electrically connected with the source electrode. For example, the source electrode and the source region may form an ohmic contact and the source electrode and the body region may form an ohmic contact.

The drain structure may be a homogenously doped structure or may include two or more differently doped sublayers forming unipolar junctions. For example, the drain structure may include a more heavily doped sublayer and a more lightly doped drift layer, wherein the more lightly doped drift layer is between the transistor cells and the more heavily doped sublayer.

The source electrode may include a source pad. The source pad, the sense pad, and, if applicable, a gate pad may be formed side-by-side at a front side of the semiconductor portion. The gate pad and the sense pad are electrically separated. In an electronic assembly including the semiconductor device, the gate pad and the sense pad can be connected to different driver outputs driving different signals.

The sense element may include a string of one or more rectifying junctions electrically connected in series between the sense pad and the source electrode. In other words, the sense element may include one single rectifying junction or a junction string with a first rectifying junction at one end and a last rectifying junction at the other end. Each rectifying junction may be a rectifying metal-semiconductor junction or a rectifying semiconductor-semiconductor junction.

The sense element may include rectifying junctions of the same type (e.g., all rectifying junctions are rectifying semiconductor-semiconductor junctions or all rectifying junctions are rectifying metal-semiconductor junctions) or of different types.

The rectifying junctions are electrically connected in series, wherein all rectifying junctions may have the same rectifying orientation. In other words, the sense element has an anode side and a cathode side, the anode side of each rectifying junction is oriented to the sense element anode side and the cathode side of each rectifying junction is oriented to the sense element cathode side.

The sense element is biased in the forward direction, when a positive voltage is applied between the anode side and the cathode side and a comparatively high forward current flows through the sense element. The sense element is biased in the reverse direction, when a negative voltage is applied between the anode side and the cathode side and a comparatively low leakage current flows through the sense element. The sense element may be operated in the forward direction or in the reverse direction.

For operation in the forward direction, the anode side of the sense element may be electrically connected to the sense pad and the cathode side may be electrically connected to the source electrode. A positive measurement voltage may be applied between the sense pad and the source electrode and the resulting forward current through the sense element is sensed. Alternatively, a measurement current may be supplied that flows in forward direction through the sense element and the resulting forward voltage drop across the sense element is sensed.

For operation in the reverse direction, the anode side of the sense element may be electrically connected to the source electrode and the cathode side may be electrically connected to the sense pad. A positive measurement voltage is applied between the sense pad and the source electrode and the resulting reverse current through the sense element is sensed. Alternatively, a measurement current may be supplied that flows in reverse direction through the sense element and the resulting reverse voltage drop across the sense element is sensed.

Both the forward voltage drop and the reverse current show a significant temperature dependency. Thus the sense element enables precise measurement of the actual junction temperature during the operation of the power semiconductor device with only low additional effort. Conventional methods, which estimate the junction temperature on the basis of electrical values measured outside the chip depend on models and/or empiric values for converting the measured value into a junction temperature and have to consider device-to-device variations. In contrast, the sense element integrated in the semiconductor portion delivers in-situ device-specific temperature information regardless of the state of the semiconductor device.

According to an embodiment, the sense element may be laterally embedded in the transistor array.

In particular, the sense element may be directly adjacent to transistor cells on all lateral sides, so that transistor cells are formed between the sense element and each lateral edge of the semiconductor portion. The transistor cells may completely surround the sense element except for a gap between the transistor cells through which a sense line extends to the sense element.

Along each straight line connecting two opposite points of an outer edge of the transistor array and extending through the sense element, a first distance between the sense element and a closer one of the two points on the outer edge of the transistor array TA is at least 20%, e.g. at least 30% of a distance between the two opposite points on the outer edge. For example, the sense element may be formed symmetrically around a lateral geometric center point of the transistor array.

Typically, the highest temperature occurs near the lateral center of the transistor array. To evaluate the signal from a sense element located at a certain distance from the lateral center, the temperature difference between the sense element and the point with the highest temperature, and the thermal conductivity of the semiconductor portion must be taken into account, wherein the thermal conductivity for wide bandgap materials is comparatively low and may depend on the state of the semiconductor crystal. By forming the sense element near or in close proximity to the center of the transistor array, the temperature measurement more accurately reflects the actual maximum temperature in the semiconductor device and responds more quickly to temperature changes. In addition, the measurement is largely independent of the density of crystal defects, which can affect thermal conductivity.

According to an embodiment, the source electrode may include a source pad, wherein the source pad has an opening directly above the sense element.

The source pad may be formed above the transistor array, wherein outer edges of the source pad and the transistor array may be parallel to each other. A horizontal outer circumference of the source pad may coincide with the horizontal outer circumference of the transistor array. Alternatively, the source pad may laterally extend beyond the transistor array on one, two, three or all four sides.

The opening may be above at least a portion of the sense element. The lateral dimensions of the opening in the source pad may be smaller or greater than the lateral dimensions of the sense element. Alternatively, the opening in the source pad and the sense element may have the same lateral dimensions.

Dielectric materials may fill at least a portion of the opening in the source pad. For example, silicon oxide, silicon nitride, siliconoxynitride, doped or undoped silicate glass and/or a polyimide may partially or completely fill the opening in the source pad.

According to an embodiment, the sense element may include one or more diode structures, wherein each diode structure includes a cathode region and a rectifying metal-semiconductor junction, and wherein a semiconductor side of the rectifying metal-semiconductor junction is directly electrically connected with the cathode region.

In particular, the semiconductor side of the rectifying metal-semiconductor junction includes a doped Schottky contact region of the same conductivity type as the cathode region. A dopant concentration in the doped Schottky contact region is lower than in the cathode region. The doped Schottky contact region and the cathode region may form a unipolar junction. The rectifying metal-semiconductor junction of each diode structure forms one of the rectifying junctions.

When the anode side of the sense element is electrically connected to the sense pad and the cathode side is electrically connected to the source electrode, the sense pad may form the metal portion of a first rectifying metal-semiconductor junction that forms the first electric contact. The source electrode and the cathode region directly electrically connected to the last rectifying metal-semiconductor junction form an ohmic contact. When the sense element is operated in the forward direction, no potentials more negative than the potential of the source electrode occur in the semiconductor portion.

When the anode side of the sense element is electrically connected to the source electrode and the cathode side is electrically connected to the sense pad, the source electrode may form the metal portion of a first rectifying metal-semiconductor junction. The sense pad and the cathode region directly electrically connected to the last rectifying metal-semiconductor junction form an ohmic contact. When the sense element is operated in the reverse direction, no potentials more negative than the potential of the source electrode occur in the semiconductor portion.

The cathode regions and the source regions of the transistor cells TC may share at least some implantations. In particular, the cathode regions and the source regions may have the same vertical dopant profile.

According to another embodiment, the sense element may include one or more diode structures, wherein each diode structure includes an anode region and a cathode region, and wherein the anode region and the cathode region of each diode structure form one of the rectifying junctions.

In particular, the anode region and the cathode region of each diode structure form a rectifying semiconductor-semiconductor junction.

When the anode side of the sense element is electrically connected to the sense pad and the cathode side is electrically connected to the source electrode, the sense pad and the anode region of the first diode structure form a first ohmic contact. The source electrode and the cathode region of the last diode structure form a second ohmic contact. When the sense element is operated in the forward direction, no potentials more negative than the potential of the source electrode occur in the semiconductor portion.

When the anode side of the sense element is electrically connected to the source electrode and the cathode side is electrically connected to the sense pad, the source electrode and the anode region of the first diode structure form a first ohmic contact. The sense pad and the cathode region of the last diode structure form a second ohmic contact. When the sense element is operated in the reverse direction, no potentials more negative than the potential of the source electrode occur in the semiconductor portion.

The anode regions and p+ contact regions of the transistor cells may share at least some implantations. In particular, the anode regions and the p+ contact regions may have the same vertical dopant profile. The cathode regions and the source regions of the transistor cells TC may share at least some implantations. In particular, the cathode regions and the source regions may have the same vertical dopant profile.

Regardless of the type of the rectifying junction, the sense element may include one single diode structure, wherein the single diode structure may include several laterally separated parts electrically connected in parallel. Alternatively, the sense element may include two or more diode structures electrically connected in series, wherein each of the diode structures may include several laterally separated parts electrically connected in parallel. In other words, the sense element may include a diode chain with one or more diode structures between the sense pad and the source electrode.

According to an embodiment, the semiconductor device may further include an isolation well of a conductivity type opposite to a conductivity type of the drain structure, wherein the isolation well extends from the front side into the semiconductor portion, and wherein the one or more diode structures are formed in a part of the semiconductor portion enclosed by the isolation well.

The isolation well may include a horizontal part and a vertical part. The horizontal part may include or may be a flat layer formed at a distance to the first surface of the semiconductor portion. A horizontal outline of the horizontal part may be a rectangle or may be approximately rectangular. The vertical part extends from the front side into the semiconductor portion down to or into the horizontal part. The vertical part may form a frame with a lateral outline corresponding to the horizontal outline of the horizontal part. The isolation well completely separates a first part of the semiconductor portion within the isolation well from a second part of the semiconductor portion outside the isolation well.

The vertical part of the isolation well and combined p+ shielding/connection regions in the transistor array may share at least some implantations. In particular, the vertical part of the isolation well and the combined p+ shielding/connection regions may have the same vertical dopant profile.

The horizontal part of the isolation well and a deep shielding region in the transistor array may share at least some implantations. In particular, the horizontal part of the isolation well and the deep shielding regions may have the same vertical dopant profile.

The isolation well separates the cathode regions of the diode structures from the drain structure.

According to an embodiment, the isolation well and the source electrode may be electrically connected through a low-conductive ohmic path.

In particular, the source electrode and the isolation well may form a low-resistive ohmic contact. For example, the source electrode includes a source pad and source contact structures extending from the source pad through an interlayer dielectric to the isolation well, wherein the source contact structures and the isolation well form ohmic contacts.

Pinning the potential of the isolation well to the source potential may reduce the risk of unintentional turn-on of parasitic bipolar transistors and/or may alleviate local charge storage effects.

According to an embodiment, the semiconductor device may further include one or more separation columns of the conductivity type of the isolation well, wherein each separation column is formed between two neighboring diode structures.

In particular, the separation columns may extend from the first surface at the front side of the semiconductor portion into the first part of the semiconductor portion enclosed by the isolation well. The separation columns may extend from the first surface down to or into the horizontal part of the isolation well.

The separation columns and the vertical part of the isolation well may be formed by using the same implant processes. In particular, the separation columns and the vertical part of the isolation well may share some or all of the implant processes and may have the same vertical dopant profile.

The separation columns and combined p+ shielding/connection regions in the transistor array may share at least some implantations. In particular, the separation columns and the combined p+ shielding/connection regions may have the same vertical dopant profile.

The separation columns may separate the doped regions of each single diode structure of the sense element from the doped regions of the neighboring diode structure(s).

According to an embodiment, the semiconductor device may further include one or more diode wells of the conductivity type of the drain structure, wherein the one or more diode wells separate the isolation well and the anode regions from each other.

In particular, both anode region and cathode region of a diode structure may be formed at a first side of the diode well and the isolation well and, if applicable, the separation columns at an opposite second side. The diode well separates the anode regions of the sense element from the isolation well.

Each diode well may include at least a horizontal part. The horizontal part may include or may be a flat layer formed at a distance to the first surface of the semiconductor portion and may be vertically stacked between the horizontal part of the isolation well and a diode layer that includes the anode regions and the cathode regions. A lateral outline of the horizontal part of the diode well may be a rectangle or may be approximately rectangular. Each diode well may also include a vertical part extending from the first surface into the semiconductor portion down to or into the horizontal part of the diode well. The vertical part may form a lateral frame with a lateral outline corresponding to the lateral outline of the horizontal part of the diode well. The diode well may completely separate a third part of the semiconductor portion within the diode well from a fourth part of the semiconductor portion outside the diode well.

According to an embodiment, the semiconductor device may further include one or more separation trenches extending from the front side into the semiconductor portion, wherein each separation trench is formed between neighboring diode structures.

In particular, the separation trenches may extend from the first surface down to or into the horizontal part of the isolation well and laterally separate neighboring diode structures and neighboring diode wells from each other.

The separation trenches may contain exclusively one or more dielectric materials. Alternatively, each separation trench may include a conductive portion and an insulating portion separating the conductive portion from the semiconducting part of the semiconductor portion. The conductive portion may include at least one of doped polycrystalline silicon, an elemental metal layer, a metal silicide layer, and a metal nitride layer. The insulating portion may include at least one of silicon oxide, siliconoxynitride and silicon nitride.

In case the transistor array includes trench gate structures, the separation trenches and the trench gate structures may have the same cross-sectional area and/or the same material configuration.

The conductive portion of a separation trench may be electrically connected with the neighboring anode region and with the neighboring cathode region. Alternatively, the conductive portions of all separation trenches may be electrically connected to the same potential.

According to another embodiment, the semiconductor device may include at least one frame trench structure, wherein each frame trench structure laterally surrounds one of the diode structures.

Each frame trench structure ("moat"; German: Burggraben) may include four straight line portions forming a rectangular frame around a part of the semiconductor portion in which the anode region and the cathode region of one diode structure are formed. The frame trench structure may include two first line portions and two second line portions. The two first line portions run parallel to a first horizontal direction. The two second line portions run orthogonal to the first horizontal direction.

In particular, the frame trench structures may extend from the first surface down to or into the horizontal part of the isolation well and may laterally separate neighboring diode structures from each other.

The first line portions and the second line portions may have the same vertical extension and the same width. In addition, the first line portions and the second line portions may have the same cross-sectional shape.

Each frame trench structure may include a conductive portion and an insulating portion separating the conductive portion from the semiconducting part of the semiconductor portion. The conductive portion may include at least one of doped polycrystalline silicon, an elemental metal layer, a metal silicide layer, and a metal nitride layer. The insulating portion may include at least one of silicon oxide, siliconoxynitride and silicon nitride.

In case the transistor array includes stripe-shaped trench gate structures, at least that line portions that run parallel to the trench gate structures may have the same cross-sectional area and/or the same material configuration as the trench gate structures.

The conductive portions of neighboring frame trench structures may be electrically separated from each other and may be electrically connected to different network nodes with different potentials in an operating mode of the semiconductor device. For example, the conductive portion of each separation trench is electrically connected to the anode region or the cathode region of the enclosed diode structure, whichever has the higher potential in an operating mode of the semiconductor device. Alternatively, the conductive portions of all frame trench structures may be electrically connected.

Neighboring, parallel line sections of two neighboring frame trench structures may be spaced from each other.

According to an embodiment, two neighboring, parallel line sections of two neighboring frame trench structures form a shared line section.

In other words, the shared line section includes two parallel, neighboring line sections of the two neighboring frame trenches. In particular, two neighboring first line portions may merge to one single common line portion with the dimensions of a non-merged line portion. Thus, the frame trench structures of a plurality of diode structures may form a ladder-like structure, wherein the merged line portions form the rungs and the line portions orthogonal to the merged line portions form the rails of the ladder.

According to an embodiment, the semiconductor device may further include a buried sense line electrically connecting the sense element and the sense pad. The sense line may extend from the first surface into the semiconductor portion. The sense line may include a conductive portion and an insulating portion separating the conductive portion from the semiconducting part of the semiconductor portion.

The conductive portion of the sense line may include at least one of doped polycrystalline silicon, an elemental metal layer, a metal silicide layer, and a metal nitride layer. The insulating portion of the sense line may include at least one of silicon oxide, siliconoxynitride and silicon nitride. The conductive portion of the sense line may be electrically connected between the sense pad and the first anode region of the sense element or between the sense pad and the last cathode region of the sense element.

According to an embodiment, the transistor cells may include stripe-shaped trench gate structures, wherein the buried sense line and the trench gate structures run parallel to each other.

In particular, the sense line may have the same lateral distance to the two neighboring trench gate structures as the trench gate structures have from each other, wherein forming the sense line does not adversely affect the process window for the trench gate structures.

According to an embodiment, the trench gate structures and the buried sense line may have a same cross-sectional shape in a cross section orthogonal to a longitudinal extension.

In particular, the sense line and the trench gate structures may have the same cross-sectional area and/or the same material configuration, wherein the sense line and the trench gate structures may be formed simultaneously using the same processes, the same materials and the same photomasks such that the sense line can be formed without that additional process steps are required.

According to an embodiment, the source electrode may include a bottom layer including first sections of a thin layer metallization, wherein wiring connections connecting neighboring ones of the diode structures include second sections of the thin layer metallization.

In particular, the source electrode may include a bottom layer (thin metallization layer) and a top layer (thick metallization layer). Each of the bottom layer and the top layer may be a homogenous layer or may include two or more vertically stacked sublayers. The top layer is formed directly on the bottom layer.

The thick metallization layer includes at least one of copper (Cu) and aluminum (Al), e.g. elemental copper (Cu), elemental aluminum (Al), or a copper-aluminum alloy with silicon (AlSiCu) or without silicon (AlCu). A thickness of the thick metallization layer may be in a range from 2 μm to 10 μm.

The thin metallization layer includes first sections forming the bottom layer of the source electrode and second sections forming the wiring connections. The thin layer metallization may be formed directly on the first surface of the semiconductor portion. The thin layer metallization may include a contact layer, e.g. based on nickel aluminum (NiAl) and/or at least one of titanium (Ti), titanium nitride (TiN), tantalum (Ta), and tantalum nitride (TaN).

According to an embodiment, the wiring connections may include a layer containing tungsten (W).

In particular, the thin layer metallization may include a tungsten layer with a thickness in a range from 150 nm to 350 nm, e.g. in a range from 200 nm to 300 nm. The tungsten layer may be formed on an interlayer dielectric that is formed on the first surface.

Figure 1B:
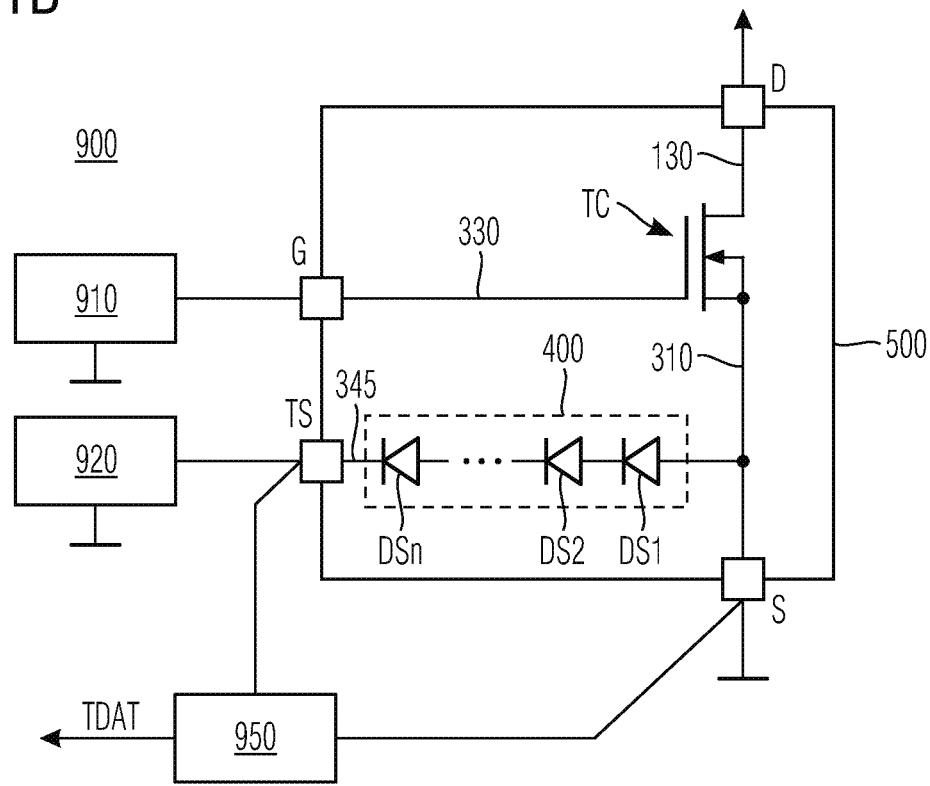

Each of FIG. 1A and FIG. 1B shows an electronic assembly 900 for continuously monitoring the temperature in a semiconductor device 500 during operation. The semiconductor device 500 may be an nMOSFET (n-channel MOSFET), e.g. a power nMOSFET. In other electronic assemblies the semiconductor device 500 may be any other power semiconductor switch, e.g., a pMOSFET (p-channel MOSFET), or an IGBT. In case of a power pMOSFET or p-channel IGBT, the cathode and anode regions are inversed. Equally, the voltage directions are inversed.

The semiconductor device 500 includes a transistor array with a plurality of transistor cells TC formed in a semiconductor portion 100 based on a single-crystalline wide band-gap material, e.g. SiC. The transistor cells TC are electrically connected in parallel between a drain structure 130 and a source electrode 310. The source electrode 310 may form or may be electrically connected to a source terminal S through a low-resistive ohmic path, e.g. a bond wire. The drain structure 130 is electrically connected to a drain terminal D.

A gate metallization 330 electrically connects the gate electrodes of the transistor cells TC. A gate terminal G may be part of the gate metallization 330 or may be electrically connected to the gate metallization 330 through a low-resistive ohmic path, e.g. a bond wire. An integrated gate resistor (not shown in FIG. 1A, FIG. 1B) may be formed between the gate terminal G and the gate metallization 330. A sense pad 345 may form or may be electrically connected to a sense terminal TS.

A sense element 400 formed in the semiconductor portion 100 includes one diode structure DS1 or a diode chain with two or more diode structures DS1, . . . , DSn electrically connected in series.

In FIG. 1A, a first anode region of the diode chain (anode region of the first diode structure DS1) is electrically connected to the sense pad 345. A last cathode region of the diode chain (cathode region of the last diode structure DSn) is electrically connected to the source electrode 310.

In FIG. 1B, a first anode region of the diode chain (anode region of the first diode structure DS1) is electrically connected to the source electrode 310. A last cathode region of the diode chain (cathode region of the last diode structure DSn) is electrically connected to the sense pad 345.

The diode structures DS1, . . . DSn may be monolithically integrated bulk diodes with the anode regions and the cathode regions formed from the single-crystalline wide band-gap semiconductor material. The built-in potential of the diode structures DS1, . . . , DSn may be about VBG—0.4V, wherein VBG is the band gap, e.g. approximately 2.9V for SiC. The number n of the diode structures DS1, . . . , DSn may be in range from one to ten. For a semiconductor device based on silicon carbide, the number of diode structures DS1, . . . , DSn may be in range from one to four. Alternatively, the diode structures DS1, . . . DSn may be monolithically integrated Schottky diodes with the cathode regions formed from the single-crystalline wide band-gap semiconductor material.

A gate driver 910 electrically connected to the gate terminal G and the source terminal S generates a gate signal and supplies the gate signal to the gate terminal G. The gate signal alternates between an active gate signal turning on the semiconductor device 500 and an inactive gate signal turning off the semiconductor device 500. The active gate signal has a voltage level exceeding a threshold voltage of the semiconductor device 500. The inactive gate signal may assume one or two voltage levels below the threshold voltage.

A measurement signal source 920 electrically connected to the sense terminal TS and the source terminal S supplies a measurement signal to the sense pad 345 and/or the source electrode 310. The measurement signal source 920 may be a constant voltage source applying a positive or negative constant voltage between the sense terminal TS and the source terminal S or may be a constant current source supplying to or sinking from the sense pad 345 a constant current. Accordingly, the measurement signal may be a load independent voltage or a load independent current.

A measurement device 950 electrically connected to the sense pad 345 and/or the source electrode 310 measures a measurand, wherein the value of the measurand is a function of the measurement signal and the temperature of the sense element 400.

For example, the measurement signal source 920 supplies a constant current to the sense terminal TS of FIG. 1A and the measurement device 950 measures the forward voltage across the sense element 400 between the sense terminal TS and the source terminal S. In case of a semiconductor device 500 with rectifying semiconductor-semiconductor junctions in a semiconductor portion from SiC, the voltage drop across each diode structure DS1, . . . , DSn decreases by 1.5 mV to 3 mV per degree K, e.g. 2 mV to 2.5 mV per degree K in the range of interest, i.e. in a temperature range from −50 degree Celsius to +500 degree Celsius.

Alternatively, the measurement signal source 920 may supply a negative constant voltage between the sense terminal TS and the source terminal S and the measurement device 950 measures the reverse current through the sense element 400.

On the basis of the measured values, the measurement device 950 outputs temperature data TDAT to a higher processing instance, e.g. to a microcontroller. On the basis of the received temperature data TDAT, the higher processing instance may estimate overheating risks. In response to an increased risk for overheating, the higher processing instance can operate the system and/or the semiconductor device 500 to relief the thermal stress and/or to bring the system in a fail-safe mode. For example, the higher processing instance may control the gate driver with reduced switching frequency, or may shut down the concerned system part.

Since the integrated sense element 400 is located directly in the semiconductor portion 500, the sense element 400 provides precise estimation about the maximum temperature in the semiconductor device 500. For estimating an overheating risk, the higher processing instance can take into account only small safety margins. Thus, the reaction to high temperature events can be more finely graduated and unnecessary system shut downs can be avoided.

The embodiments illustrated in FIG. 1A and FIG. 1B refer to an electronic assembly 900 that includes: a semiconductor device 500 as described above; a measurement signal source 920 configured to supply a measurement signal to the sense pad 345 and/or the source electrode 310; and a measurement device 950 electrically connected to the sense pad 345 and/or the source electrode 310 and to measure a measurand, wherein the measurand is a function of the measurement signal and a temperature of the sense element 400.

Figure 2:
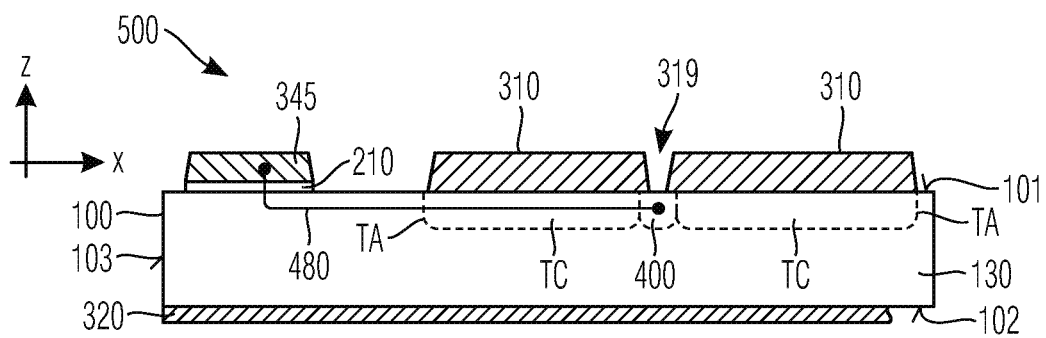
FIG. 2 is a schematic vertical cross-sectional view of a wide bandgap semiconductor device including a sense element and a sense pad according to an embodiment.

FIG. 2 shows a placement of a sense element 400 in the semiconductor portion 100.

The semiconducting part of the semiconductor portion 100 includes or consists of a single crystalline wide bandgap semiconductor with a bandgap of at least 2 eV, e.g., a single-crystalline silicon carbide crystal with the main constituents silicon and carbon. The silicon carbide crystal may include dopant atoms and further impurities like hydrogen, fluorine and/or oxygen. The polytype of the silicon carbide crystal may be 15R or hexagonal, e.g. 2H, 6H, or 4H. The semiconductor portion 100 may include or consist of a crystalline silicon carbide layer grown by epitaxy.

A first surface 101 at a front side of the semiconductor portion 100 may be planar or ribbed. A mean plane of the first surface 101 extends along horizontal directions. The mean plane of a planar first surface 101 is identical with the planar first surface 101. In case of a non-planar first surface 101, for example in case of a ribbed first surface 101, the mean plane may be a planar least squares plane. Position and orientation of the planar least squares plane are defined such that the sum of the squares of the deviations of surface points of the ribbed first surface 101 from the planar least squares plane has a minimum.

Opposite to the front side, a second surface 102 of the semiconductor portion 100 extends parallel to the planar first surface 101 or parallel to the least squares plane of a ribbed first surface 101. A lateral outer surface 103 connects the edge of the first surface 101 and the edge of the second surface 102.

The semiconductor portion 100 has a surface extension along two horizontal directions and a thickness along a vertical direction perpendicular to the horizontal directions. The horizontal directions are parallel to an x-axis and to a y-axis, wherein x-axis and y-axis are orthogonal to each other. The vertical direction is parallel to a z-axis, which is orthogonal to the x-axis and to the y-axis.

The vertical direction may coincide with a main lattice direction or may be tilted to a main lattice direction by an off-axis angle, wherein the off-axis angle may be in a range from 2° to 8°, in particular about 4°.

The transistor array TA includes a plurality of transistor cells TC electrically connected in parallel. Doped regions of the transistor cells TC are formed in the semiconductor portion 100 along the first surface 101. The drain structure 130 separates the transistor cells TC from the second surface 102. A metallic rear side electrode 320 formed on the second surface 102 and the drain structure 130 form a low-resistive ohmic contact.

A source electrode 310 and a sense pad 345 are formed on the first surface 101. The source electrode 310 and the transistor cells TC form low-resistive ohmic contacts. An interlayer dielectric 210 separates the sense pad 345 and the semiconductor portion 100.

The sense element 400 is laterally embedded in the transistor array TA. A sense line 480 electrically connects the sense element 400 and the sense pad 345. The source electrode 310 has an opening 319 above the sense element 400.

Transistor cells TC are formed on all lateral sides of the sense element 400. In particular, transistor cells TC are formed between the sense element 400 and each lateral edge of the semiconductor portion 100. The transistor cells TC may completely surround the sense element 400 apart from a gap through which the sense line 480 extends to the sense element 400.

Typically, the highest temperatures occur in or in close proximity of the lateral center of the transistor array TA. By forming the sense element 400 near the center of the transistor array TA, the measured temperature accurately reflects the actual highest temperature in the semiconductor device.

Figure 3A:
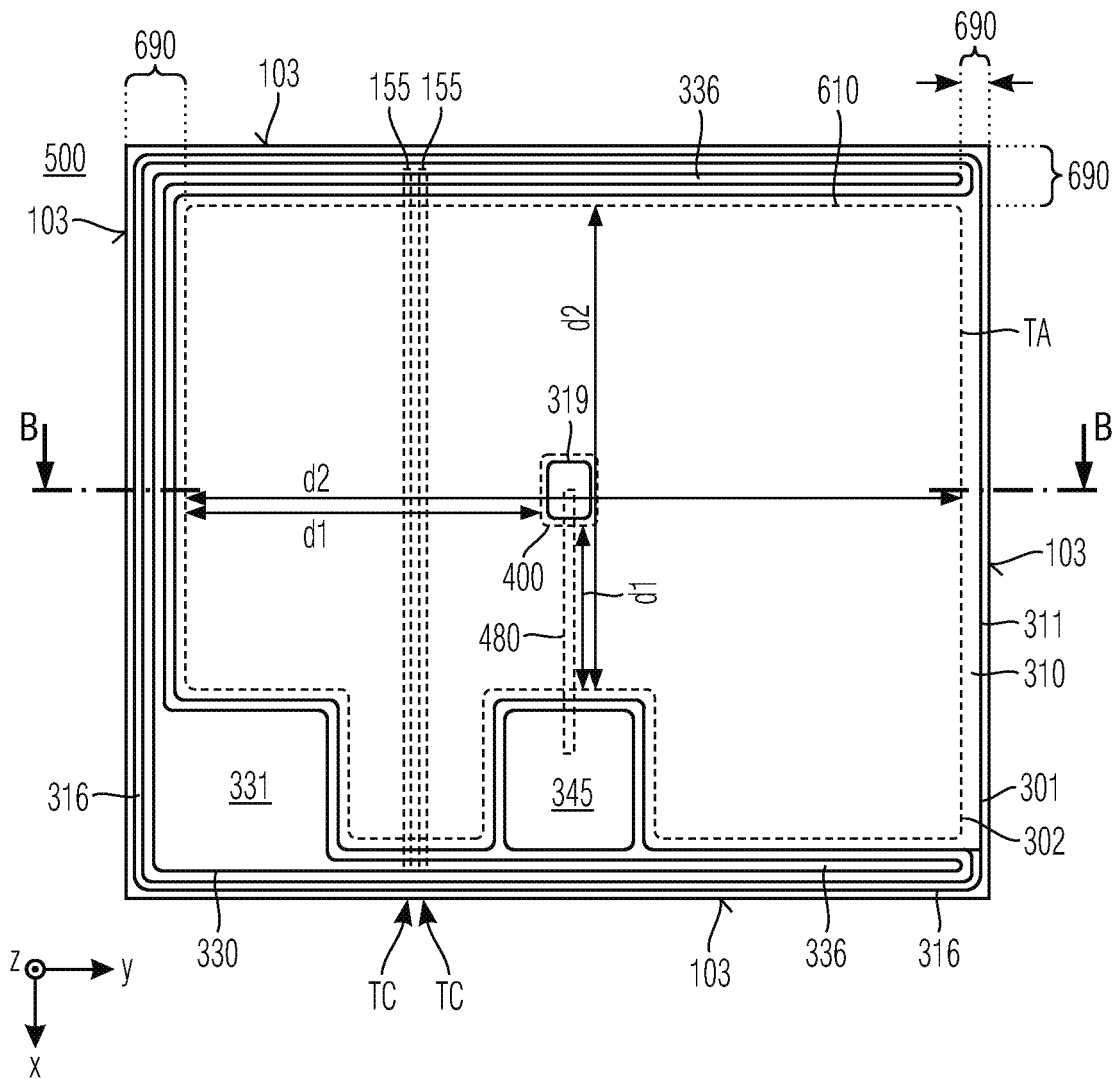
FIG. 3A shows a schematic plan view of a semiconductor device according to an embodiment with a sense pad formed along the chip edge.
Figure 3B:
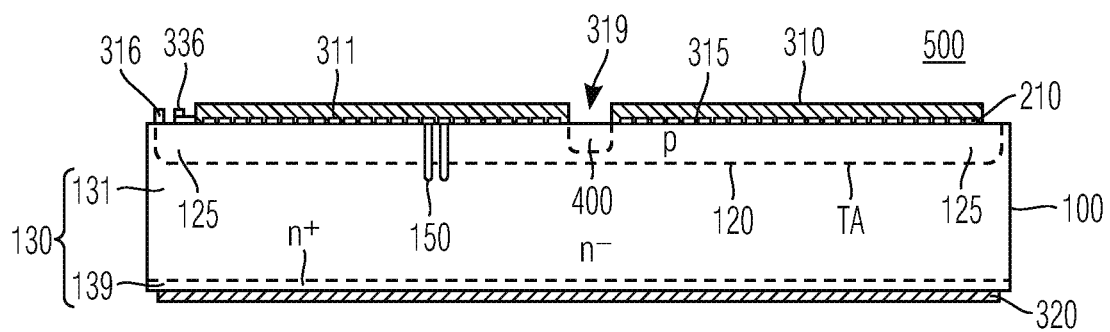
FIG. 3B shows a schematic vertical cross sectional view of the semiconductor device of FIG. 3A along line B-B.

The semiconductor device 500 shown in FIGS. 3A and 3B is a SiC-TMOSFET (silicon carbide trench MOSFET) with a voltage blocking capability in a range from 400V to 10 kV or more.

The semiconductor device 500 includes a central region 610 and a peripheral region 690 surrounding the central region 610. The central region 610 includes the transistor array TA. In particular, the central region 610 is the smallest shape that includes all portions of the first surface through which a current flows in the on-state of the semiconductor device 500 and which is formed by rectangular edges. The peripheral region 690 separates the central region 610 from the lateral surface 103. The transistor cells TC may include stripe-shaped gate electrodes 155 with a lateral longitudinal extension parallel to the x-axis. Alternatively, the transistor cells TC may include a grid-shaped electrode, wherein the transistor cells TC are formed in rows and columns.

A source electrode 310 includes a metal source pad 311, a source runner 316 and source contact structures extending through openings in an interlayer dielectric 210 to or into source regions and body regions of the transistor cells TC. The gate electrodes 155 extend beyond the edges of the source pad 311 and into the peripheral region 690.

The gate metallization 330 includes a gate pad 331 and a gate runner 336. The gate pad 331 is sufficiently large and thick to serve as wire bond pad. The gate runner 336 is formed in the peripheral region 690 between the source pad 311 and the lateral outer surface 103 of the semiconductor portion 100 and is in direct contact with the gate pad 331.

The gate runner 336 has first line portions with a lateral longitudinal extension parallel to the y-axis. The first line portions cross the gate electrodes 155 and form low-resistive contacts with the gate electrodes 155. One of the first line portions may be directly connected to the gate pad 331.

The gate runner 336 includes one or two second line portions with a lateral longitudinal extension parallel to the x-axis. One of the second line portions connects one of the first line portions and the gate pad 331.

Between the gate pad 331 and the gate runner 336 an integrated gate resistor may be included (not shown in FIGS. 3A, 3B). In this case, the metallic connection between the gate pad 331 and the gate runner 336 may be missing. Instead, the gate pad 331 is electrically connected to a first side of the integrated gate resistor and the gate runner 336 is electrically connected to a second side of the integrated gate resistor. The integrated gate resistor may include doped polycrystalline silicon, a thin metal line and/or a doped region in the semiconductor portion 100. The source runner 316 is formed between the gate runner 336 and the lateral outer surface 103.

The transistor array TA includes a p doped body/shielding structure 120 extending from the first surface 101 into the semiconductor portion 100. Sections of the p doped body/shielding structure 120 within the central region 610 form body regions and shielding regions of the transistor cells TC, wherein the body regions may be more lightly doped than the shielding regions. The source regions of the transistor cells TC may extend from the first surface 101 into the p doped body/shielding structure 120 and are omitted for clarity in FIG. 3B.

A section of the p doped body/shielding structure 120 outside the central region 610 forms a termination structure, e.g. a junction termination extension 125. The source runner 316 and the junction termination extension 125 form low-resistive ohmic contacts.

The drain structure 130 may include a lightly doped drift layer 131 and a more heavily doped drain layer 139. The drift layer 131 separates the p doped body/shielding structure 120 and the drain layer 139 along the z-axis. The drain layer 139 and a metallic rear side electrode 320 form a low-resistive ohmic contact. The metallic rear side electrode 320 may form a drain terminal or may be electrically connected to a drain terminal through a low resistive path, e.g. a bond wire.

A sense pad 345 on the first surface 101 may have similar dimensions as the gate pad 331. The sense pad 345 is formed between the transistor array TA and the lateral outer surface 103 and may be in the center of one of the lateral edges of the transistor array TA. The sense pad 345, the gate pad 331 and the source pad 311 may have the same material configuration and the same vertical dimensions.

In particular, each of the sense pad 345, the gate pad 331 and the source pad 311 includes a section of a thin metallization layer 301 and a section of a thick metallization layer 302 formed directly on the thin metallization layer 301. The gate runner 336, the source runner 316 and wiring connections of the sense element 400 may include sections of the thin metallization layer 301.

A sense element 400 is formed in close in the lateral center of in close proximity to the lateral center of the central region 610. The sense pad 345 is separated from the sense element 400 along the x-axis. A sense line 480 electrically connects the sense pad 480 and the sense element 400. The source pad 311 may include an opening 319 above the sense element 400.

The sense element 400 is laterally embedded in the transistor array TA. Along each straight line connecting two opposite points of an outer edge of the transistor array TA and extending through the sense element 400, a first distance d1 between the sense element 400 and a closer one of the two points on the outer edge of the transistor array TA is at least 20% and not more than 80%, e.g. at least 30% and not more than 70% of a second distance d2 between the two opposite points on the outer edge. For example, the sense element 400 may be formed symmetrically around a lateral geometric center of the transistor array TA.

Figure 4A:
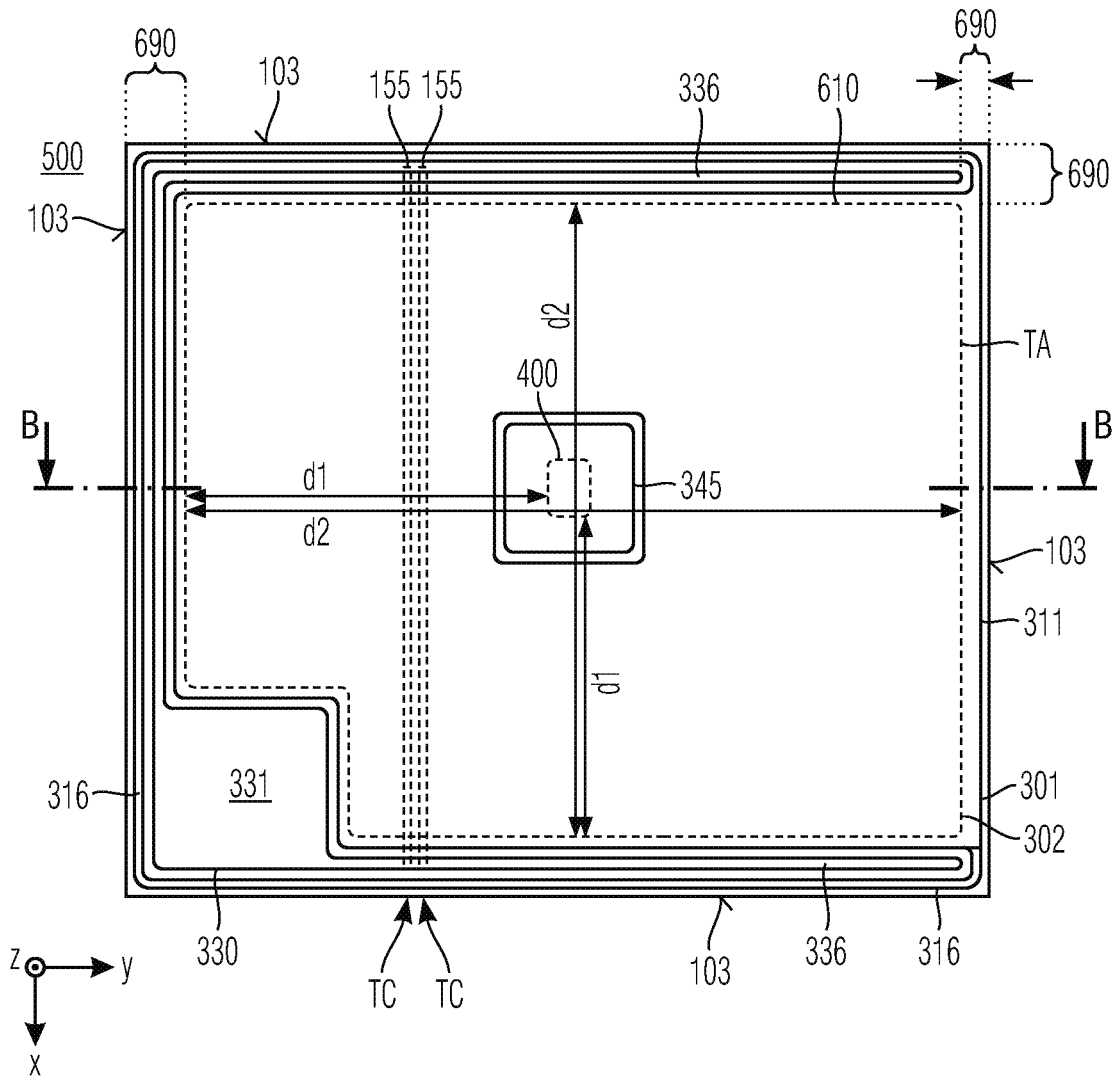
FIG. 4A shows a schematic plan view of a semiconductor device according to an embodiment with a central sense pad.
Figure 4B:
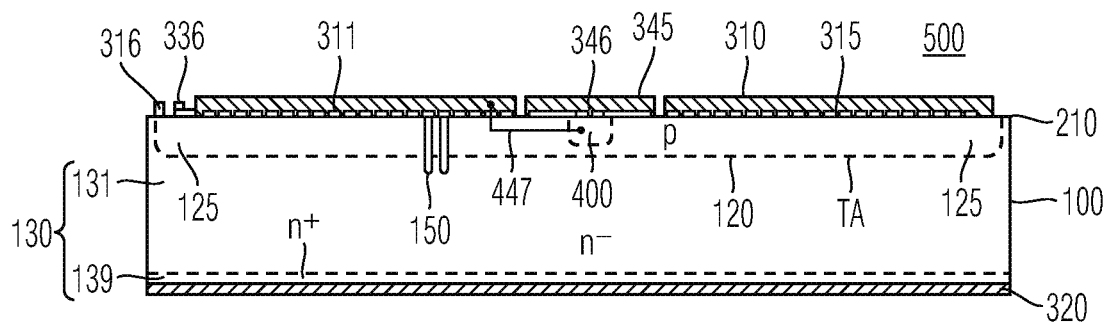
FIG. 4B shows a schematic vertical cross sectional view of the semiconductor device of FIG. 4A along line B-B.

FIG. 4A and FIG. 4B illustrate a semiconductor device 500 with the sense pad 345 formed directly above the sense element 400. In particular, the sense element 400 may be completely formed directly below the sense pad 345. One or more sense contact structures 346 extend through openings in the interlayer dielectric 210 to or into the sense element 400. For example, the one or more sense contact structures 346 and the first anode regions of the sense element 400 may form low-resistive ohmic contacts. Alternatively, the one or more sense contact structures 346 and the last cathode regions of the sense element 400 may form low-resistive ohmic contacts. A sense connection structure 447 electrically connects the sense element 400 with the source pad 311.

In FIG. 5 the semiconductor device 500 is or includes a SiC-MOSFET with a plurality of insulated gate transistor cells TC formed at the front side of a semiconductor portion 100.

Each transistor cell TC includes a source region 110 and a body region 121, wherein the source region 110 and the body region 121 are doped portions of the semiconductor portion 100. The source region 110 has a first conductivity type. The body region 121 has a second conductivity type. In the illustrated embodiment, the source region 110 is n conducting, and the body region 121 is p conducting. The body region 121 is a part of a contiguous, p doped body/shielding structure 120 of the second conductivity type, wherein the doped body/shielding structure 120 includes further regions, for example, shielding regions, connection regions, and/or body contact regions.

Each transistor cell TC further includes a gate structure 150. In the illustrated embodiment, the gate structures 150 are trench gate structures extending from the first surface 101 into the semiconductor portion 100. Alternatively, the gate structures 150 may be planar gates formed on the first surface 101.

Each gate structure 150 includes a conductive gate electrode 155 and a gate dielectric 159 between the gate electrode 155 and a body region 121 associated with the gate structure 150. The gate electrode 155 may include at least one of heavily doped polycrystalline silicon, an elemental metal, a metal silicide, a metal nitride, and a metal alloy. The gate dielectric 159 may consist of or may include silicon oxide, silicon nitride and/or siliconoxynitride, by way of example.

A drain structure 130 laterally extends through the semiconductor portion 100 between the transistor cells TC and the second surface 102. The drain structure 130 may include a voltage sustaining structure, e.g., a charge compensation structure and/or a lightly n doped drift layer 131. The drain structure 130 further includes a more heavily doped n+ drain layer 139 along the second surface 102.

A metallic source electrode 310 at the front side of the semiconductor portion 100 electrically connects the source regions 110 and the body regions 121 of the transistor cells TC. The source electrode 310 may include a source terminal S. Alternatively, a low-resistive ohmic path electrically connects the source electrode 310 and the source terminal S.

A metallic rear side electrode 320 and the drain layer 139 form an ohmic contact. The metallic rear side electrode 320 may include a drain terminal D. Alternatively, a low-resistive ohmic path electrically connects the rear side electrode 320 and the drain terminal D.

A gate metallization 330 at the front side of the semiconductor portion 100 electrically connects the gate electrodes 155 of the transistor cells TC. The gate metallization 330 may include a gate terminal G. Alternatively, a low-resistive ohmic path electrically connects the gate metallization 330 and the gate terminal G.

A p doped isolation well 430 extends from the front side into the semiconductor portion 100. The p doped isolation well 430 may be a section of the p doped body/shielding structure 120. One or more diode structures DS1, . . . , DSn of a sense element 400 are formed in a part of the semiconductor portion 100 enclosed by the isolation well 430.

The isolation well 430 includes a horizontal part 431 and a vertical part 432. The horizontal part 431 is a flat layer formed at a distance to a first surface 101 of the semiconductor portion 100. The vertical part 432 extends from the front side into the semiconductor portion 100 down to or into the horizontal part 431. The vertical part 432 forms a frame with a lateral outline corresponding to the horizontal outline of the horizontal part 431.

The source electrode 310 and the isolation well 430 form a low-conductive ohmic contact. For example, a portion of the source electrode 310 may be in direct contact with the vertical part 432 of the isolation well 430.

N doped diode wells 440 extend from the first surface 101 into the p doped isolation well 430 and separate the diode structure DS1, . . . , DSn from the isolation well 430. Each diode structure DS1, . . . , DSn is formed at one side of a diode well 440 and the isolation well 430 is formed at the opposite side of the diode well 440.

The diode wells 440 of neighboring diode structures DS1, . . . , DSn may be formed in close proximity to each other. Separation columns 435 of the conductivity type of the isolation well 430 extend from the first surface 101 down to the horizontal part 431 of the isolation well 430 and laterally separate neighboring diode wells 440 from each other.

A vertical dopant profile in the separation columns 435 is sufficiently high to keep the gain of a parasitic npn bipolar transistor small, which is formed by the n doped drift layer 131, the isolation well 430 and the diode wells 440. The separation columns 435 and the vertical part 432 of the isolation well 430 may have the same vertical dopant profile.

Each diode structure DS1, . . . , DSn includes a p type anode region 411 and an n type cathode region 412. The anode region 411 and the cathode region 412 of one diode structure DS1, . . . , DSn extend from the first surface 101 into the diode well 440 associated with the diode structure DS1, . . . , DSn. Each pair of an anode region 411 and a cathode region 412 in a diode well 440 forms a diode structure DS1, . . . , DSn and one of the pn junctions of the sense element 400. The number n of diode structures DS is in a range from one to ten.

The sense pad 345 and the anode region 411 of a first diode structure DS1 form a first ohmic contact OC1. The source electrode 310 and the cathode region 412 of a last diode structure DSn form a second ohmic contact OC2.

The anode regions 411 and p+ contact regions of the transistor cells TC may have the same vertical dopant profile. The cathode regions 412 and the source regions 110 of the transistor cells TC may have the same vertical dopant profile.

For each pair of neighboring diode structures DS1, . . . , DSn, a wiring connection 347 forms part of an electrical connection between the cathode region 412 of a first one of the neighboring diode structures DS and the anode region 411 of a second one of the neighboring diode structures DS. The diode structures DS1, . . . , DSn form a diode chain DC electrically connected in forward direction between the sense pad 345 and the source electrode 310.

The n doped diode well 440, the p doped isolation well 430 and the drain/drift structure 130 form a parasitic npn bipolar transistor, wherein a steep dV/dt signal at the drain side may excite a hole current flow along the bottom of the n doped diode wells 440 in direction of the source contacts of the isolation well 430. Subject to the condition that the conductivity of the isolation well 430 is sufficiently high, a resulting voltage drop along the pn junction between the diode well 440 and the isolation well 430 typically remains safely below the threshold required for starting a latch-up event. Since the wide bandgap of the material of the semiconductor portion 100 results in a comparatively high threshold voltage for latch-up, a moderate dopant concentration in the isolation well 430 may be sufficient even under consideration of the reduction of the threshold voltage for latch-up with increasing temperature. In addition, the short charge carrier lifetime in SiC reduces the latch-up risk, because holes entering the diode wells 170 recombine fast.

Figure 6:
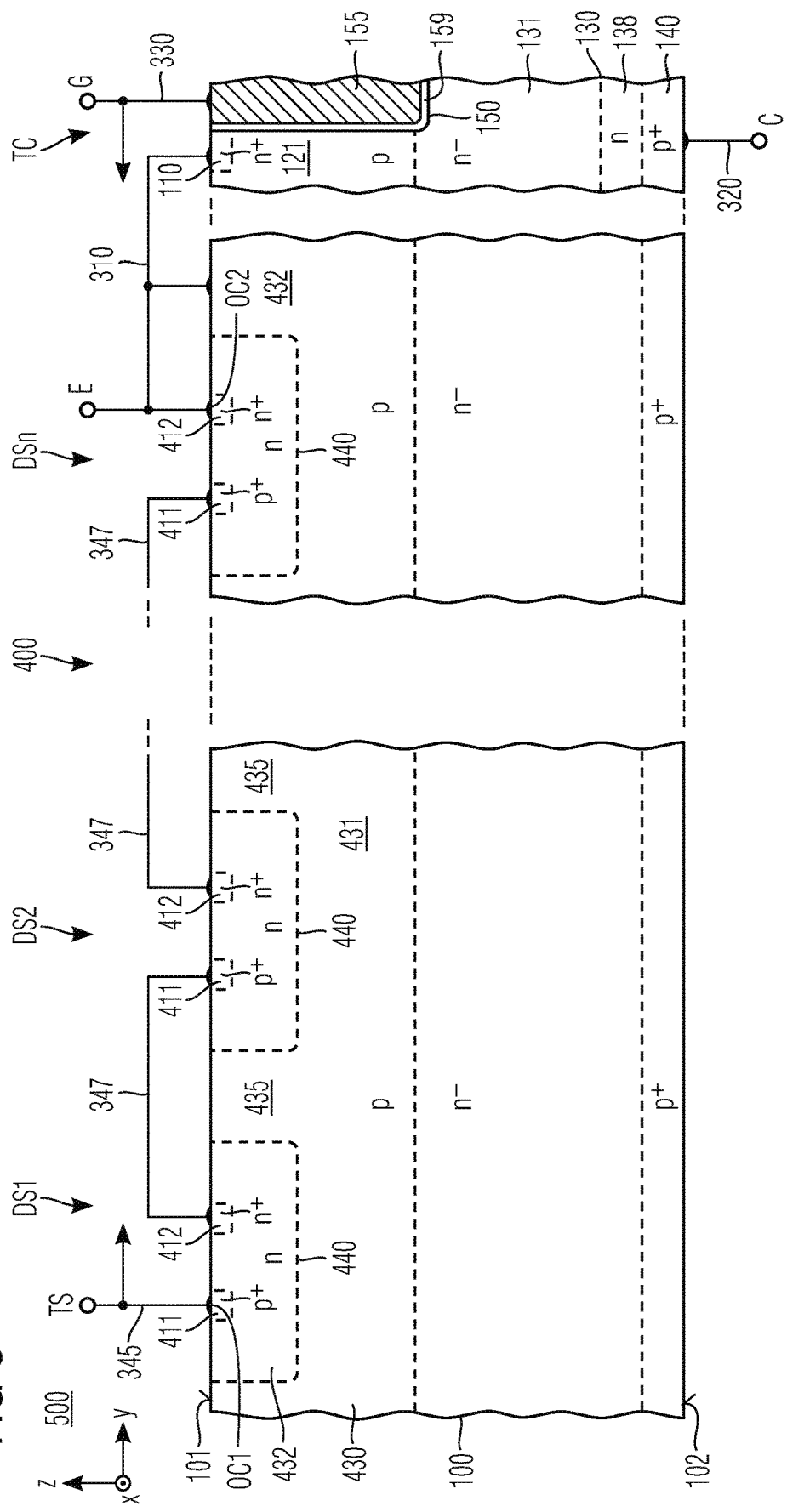
FIG. 6 shows a schematic vertical cross sectional view of a portion of a semiconductor device with a sense element including four pn junctions according to an embodiment concerning an IGBT.

In FIG. 6 the semiconductor device 500 is or includes an IGBT. The semiconductor portion 100 includes a contact layer 140 separating the drain structure 130 from the second surface 102. The contact layer 140 may be p doped or may include zones of both conductivity types alternating along at least one lateral direction. An n doped buffer layer 138 with a higher dopant concentration than the drift layer 131 may be formed between the drift layer 131 and the contact layer 140 at least in the central region of the semiconductor portion 100, wherein the central region includes the transistor array with the transistor cells TC.

The metallic rear side electrode 320 may form a collector terminal C. Alternatively, a low-resistive ohmic path electrically connects the rear side electrode 320 and the collector terminal C.

The metallic source electrode 310 may include an emitter terminal E. Alternatively, a low-resistive ohmic path electrically connects the source electrode 310 and the emitter terminal E.

Figure 7:
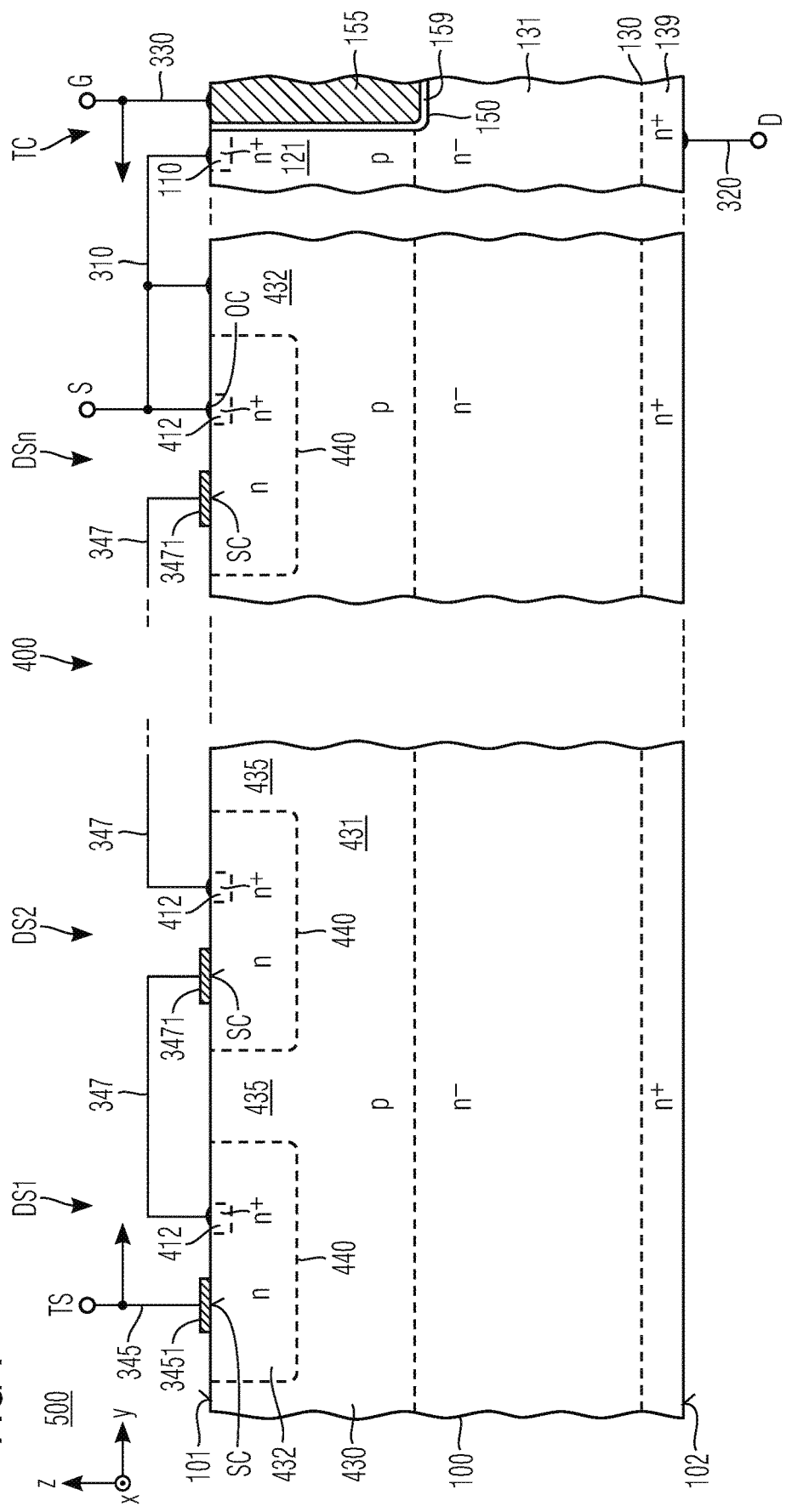
FIG. 7 shows a schematic vertical cross sectional view of a portion of a semiconductor device according to an embodiment concerning a sense element including Schottky contacts.

In the semiconductor device of FIG. 7, each of the diode structures DS1, DS2, . . . , DSn includes one Schottky contact SC.

Each diode structure DS1, . . . , DSn includes an n type cathode region 412 extending from the first surface 101 into the diode well 440 associated with the diode structure DS1, ..., DSn. A wiring connection 347 forms part of an electrical connection between the cathode region 412 of a first one of two neighboring diode structures DS and the diode well 440 of a second one of the neighboring diode structures DS. Each wiring connection 347 includes a Schottky metal layer 3471 in direct contact with at least the diode well 440 of the second one of the neighboring diode structures DS. The Schottky metal layer 3471 and the diode well 440 form one Schottky contact SC. In addition, the sense pad 345 may include a Schottky metal layer 3451 that forms the metal portion of a first one of the Schottky contacts SC.

The diode well 440 forms a doped Schottky contact region with a dopant concentration lower than in the cathode region 412. The diode well 440 and the cathode region 412 form a unipolar junction.

The Schottky metal layers 3451, 3471 may contain at least of one of aluminum (Al), platinum (Pt), palladium (Pd), nickel (Ni), titanium (Ti), copper (Cu) and molybdenum (Mo), e.g. an aluminum copper alloy (AlCu). The temperature coefficient of the forward current may be negative for lower forward currents and may be positive for higher forward currents.

Each pair with one Schottky contact SC and one cathode region 412 in the same diode well 440 forms a diode structure DS1, ..., DSn. The number n of diode structures DS is in a range from one to ten.

The sense pad 345 may form the metal portion of a first rectifying metal-semiconductor junction of the first diode structure DS1. The source electrode 310 and the cathode region 412 directly electrically connected to the last rectifying metal-semiconductor junction SC form an ohmic contact between the source electrode 310 and the last rectifying junction SC.

In each of the following figures that show diode structures DS1, DS2, ..., DSn with pn junctions as rectifying junctions, the pn junction of each diode structure DS1, DS2, ..., DSn can be replaced with a Schottky contact, wherein the anode region 411 is omitted, and wherein the sense pad 345 and/or the wiring connections 347 include a Schottky metal layer in direct contact with the diode well 440 as shown in FIG. 7.

Figure 8:
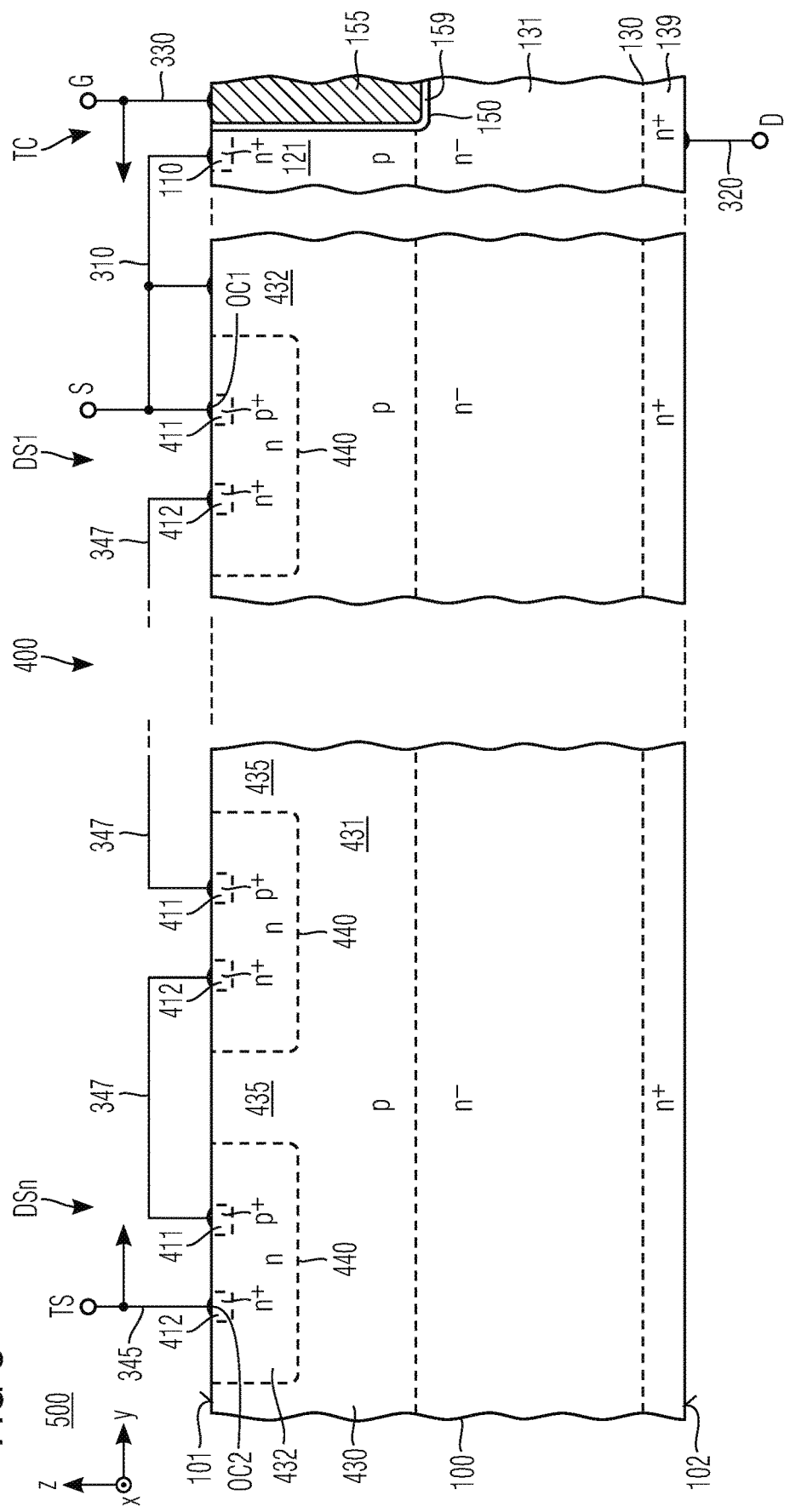
FIG. 8 shows a schematic vertical cross sectional view of a portion of a semiconductor device according to an embodiment concerning a sense element oriented as in FIG. 1B.

FIG. 8 refers to a semiconductor device 500 with the anode side of the sense element connected to the source electrode 310 and with the cathode side of the sense element electrically connected to the sense pad 345 as an example for the semiconductor device 500 in FIG. 1B.

The anode region 411 of the first diode structure DS1 and the source electrode 310 form a first ohmic contact OC1. The cathode region 412 of the last diode structure DSn and the sense pad 345 form a second ohmic contact. The diode structures DS1, ... DSn can be operated in the reverse direction without that potentials more negative than the potential of the source electrode 310 occur in the semiconductor portion 100.

Figure 9:
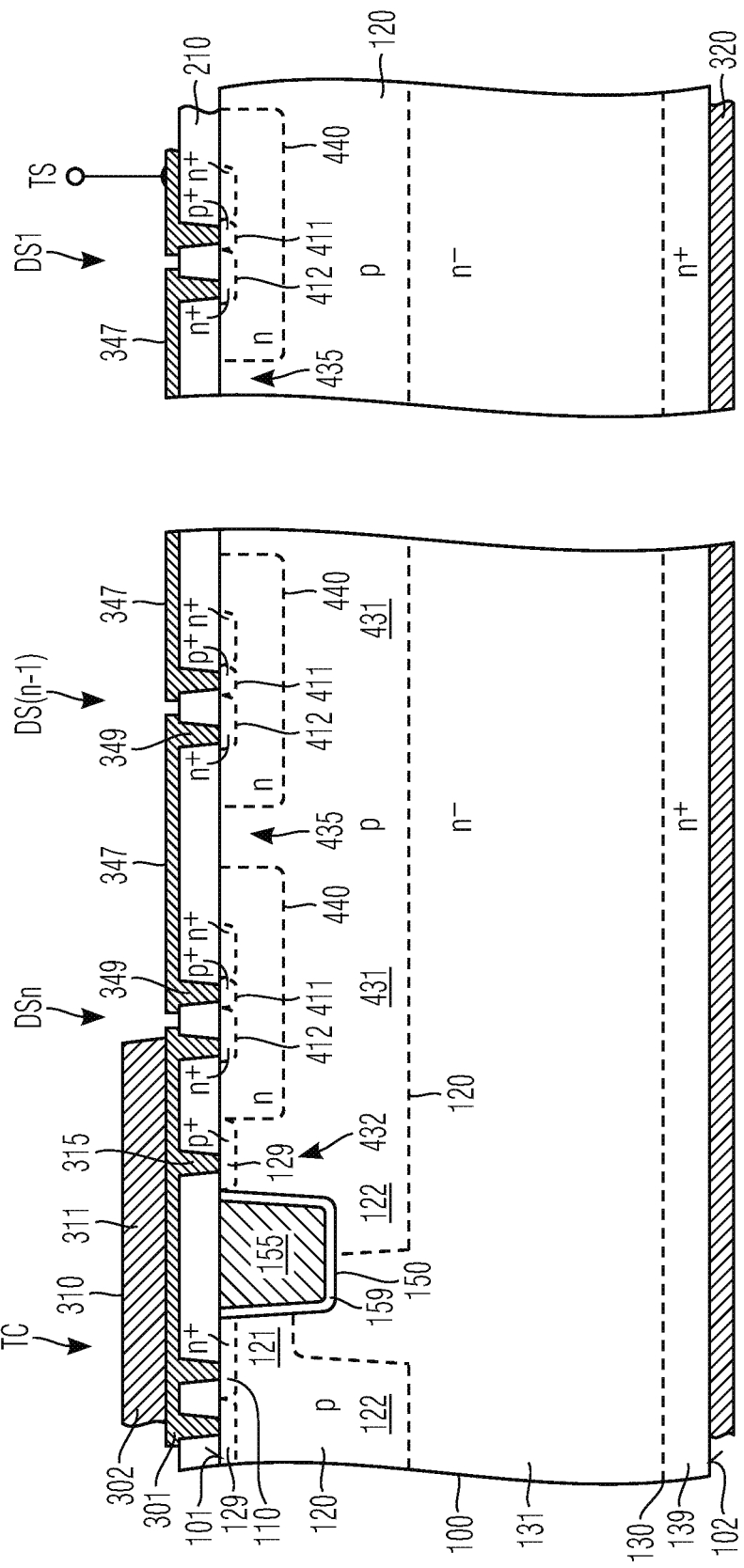
FIG. 9 shows a schematic vertical cross sectional view of a portion of a semiconductor device according to another embodiment concerning a sense element with pn junctions separated by junctions.

FIG. 9 concerns a SiC-TMOSFET with asymmetric transistor cells TC and trench gate structures 150. The sidewalls of the gate structures 150 are slightly tilted against the vertical direction such that one of the longitudinal gate structure sidewalls (the active sidewall) is parallel to a crystal plane with high electron mobility, e.g. the [11-20] crystal plane.

The source region 110 and the body region 120 of the transistor cell TC and a portion of the drain structure 130 are in direct contact with the active sidewall of the gate structure 150. Along the inactive sidewall, a shielding region 122 extends from the first surface 101 to below the bottom of the gate structure 150 and shields the bottom of the gate structure 150 against the drain potential. The shielding region 122 is part of the p doped body/shielding structure 120. The p doped body/shielding structure 120 may further include more heavily doped body contact regions 129 (surface regions of the shielding region 122) along the first surface 101.

The source pad 311 includes source contact structures 315 extending through openings in an interlayer dielectric 210 to the source regions 110, to the body contact regions 129 and to the cathode region 412 of the last diode structure DSn.

Wiring contact structures 349 extend from wiring connections 347 through openings in the interlayer dielectric 210 to the cathode regions 412 and the anode regions 411 of the diode structures DS1, ..., DSn to connect neighboring ones of the diode structures DS1, ..., DSn. Each cathode region 412 may form a ring or frame around the anode region 411 of the same diode structure DS1, ..., DSn.

The source pad 311 includes a section of a thin metallization layer 301 and a section of a thick metallization layer 302 formed directly on the thin metallization layer 301. The gate runner 336, the source runner 316 and the wiring connections 347 include sections of the thin metallization layer 301.

The thin metallization layer 301 may consist of or include tungsten (W). For example, the thin metallization layer 301 is a layer formed by depositing 150 nm to 350 nm tungsten (W) and annealing the deposited tungsten (W). Alternatively or in addition to a tungsten containing layer, the thin metallization layer 301 may include at least one further sub-layer. The further sub-layer may include titanium (Ti), titanium nitride (TiN), tantalum (Ta), tantalum nitride (TaN) and/or another elemental metal, metal compound or metal alloy. A thickness of the thin metallization layer 301 may be in a range from 100 nm to 500 nm, by way of example.

The thick metallization layer 302 may consist of copper (Cu), aluminum (Al) or an alloy containing at least one of copper (Cu) and aluminum (Al). A thickness of the thick metallization layer 302 may be in a range from 2 μm to 10 μm, by way of example.

Figure 10:
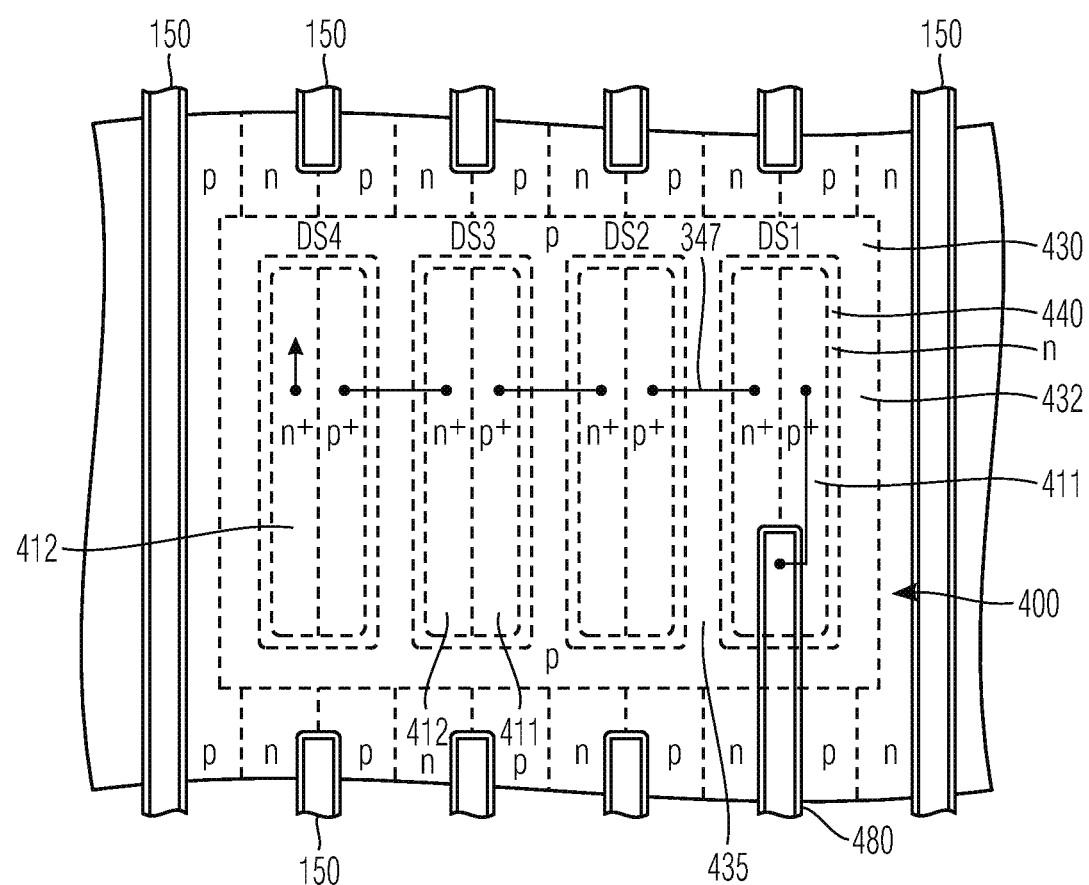
FIG. 10 shows a schematic plan view of a portion of a semiconductor device according to an embodiment concerning a sense element including pn junctions separated by junctions and a buried sense line.
Figure 11:
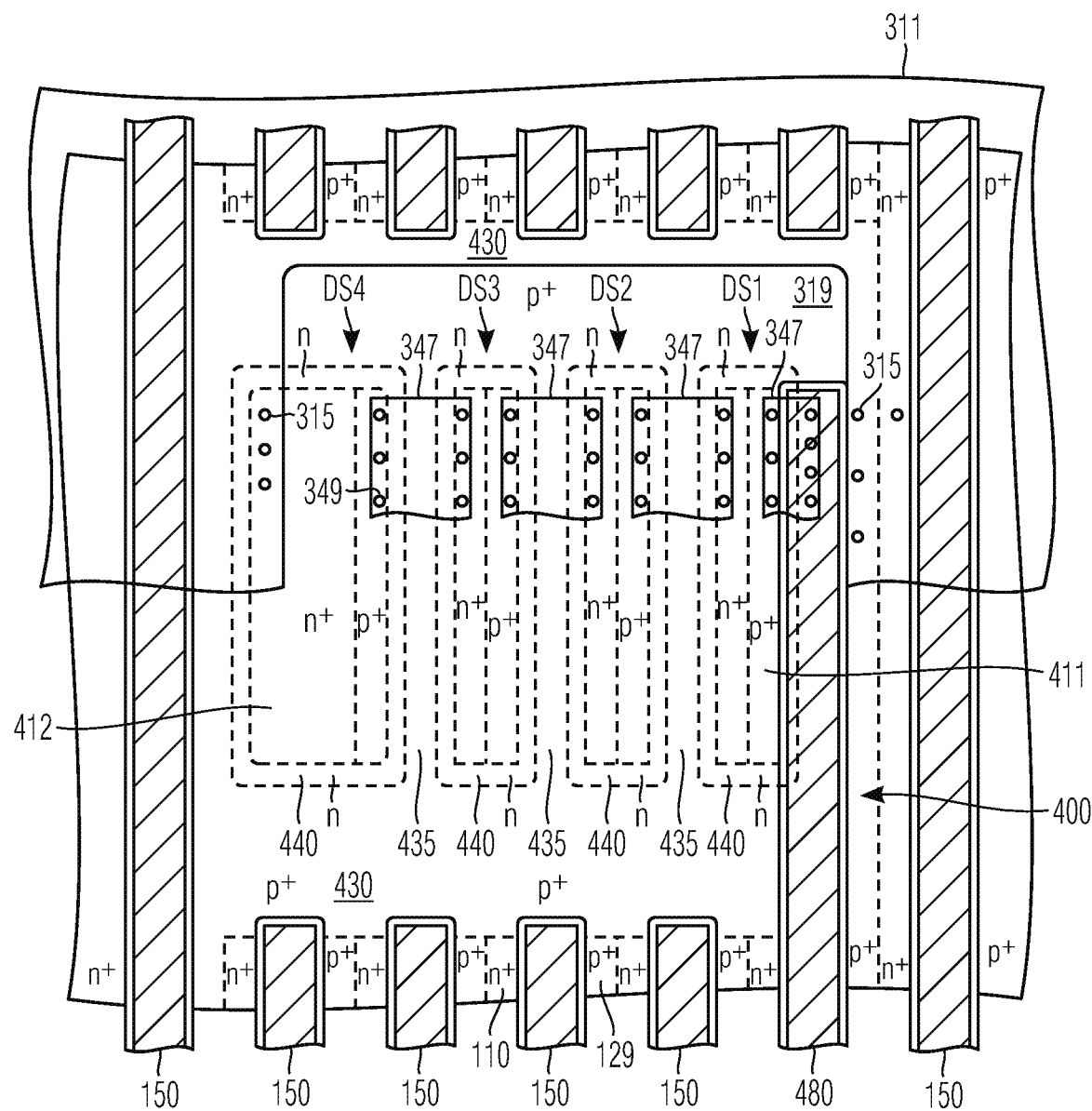
FIG. 11 shows a schematic plan view of a portion of a semiconductor device according to an embodiment with a sense element including pn junctions and wiring connections connecting the pn junctions.

FIG. 10 and FIG. 11 show sense elements 400 with four diode structures DS1, DS2, DS3, DS4 arranged along the y-axis, wherein a center-to-center distance between neighboring diode structures DS1, DS2, DS3, DS4 is equal to a center-to-center distance between neighboring gate structures 150.

The anode region 411 and the cathode region 412 of each diode structure DS1, DS2, DS3, DS4 are formed within an n-type diode well 440. The diode wells 440 are formed within a p-type separation well 430. P-type separation columns 435 laterally separate neighboring diode wells 440.

The sensor element 400 interrupts four gate structures 150 into eight trench structure portions. Seven of the trench structure portions form gate structures 150 of functional transistor cells. One of the trench structure portions extends into the sensor element 400 and forms a buried sense line 480. A conductive portion of the sense line 480 and the anode region 411 of the first diode structure DS1 are electrically connected. The cathode region 412 of the last diode structure DS4 and the source electrode are electrically connected. Wiring connections 347 electrically connect neighboring diode structures DS1, DS2, DS3, DS4.

In FIG. 10 the seven trench structure portions forming gate structures 150 of functional transistor cells are laterally separated from the sensor element 400.

In FIG. 11 the seven trench structure portions forming gate structures 150 of functional transistor cells end in the isolation well 430.

FIG. 11 further shows a source pad 311 with an opening 319 above the sense element 400. Source contact structures 315 extend from the source pad 311 and form ohmic contacts with the isolation well 430 and with the cathode region 412 of the last diode structure DS4. A further wiring connection 347 is provided for connecting the conductive portion of the sense line 480 with the anode region 411 of the first diode structure DS1.

Figure 12:
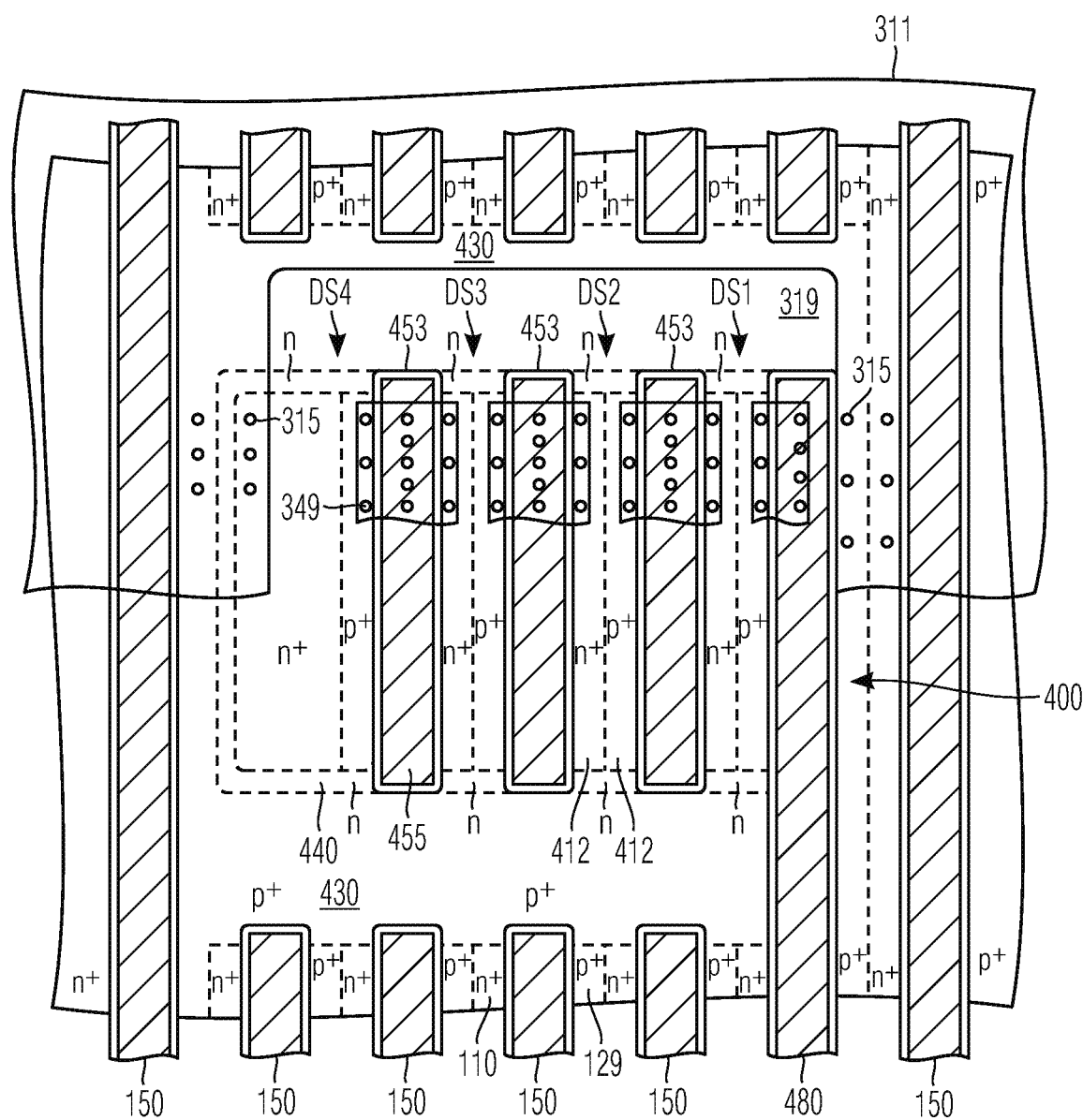
FIG. 12 shows a schematic plan view of a portion of a semiconductor device according to an embodiment with a sense element including pn junctions separated by separation trenches.

In FIG. 12 separation trenches 453 laterally separate neighboring ones of the diode structures DS1, DS2, DS3, DS4. The separation trenches 453 have the same center-to-center distance as the gate structures 150. The separation trenches 453 laterally separate neighboring diode wells 440. The gate structures 150 and the separation trenches 453 have the same cross-sectional area and the same material configuration.

Wiring contact structures 349 extend from the wiring connections 347 through openings in the interlayer dielectric 210 to the cathode regions 412 and the anode regions 411 of the diode structures DS1, DS2, DS3, DS4 and to conductive portions 455 of the separation trenches 453 to connect neighboring ones of the diode structures DS1, DS2, DS3, DS4 with each other and with the conductive portion 455 of the intermediate separation trench 453.

Figure 13:
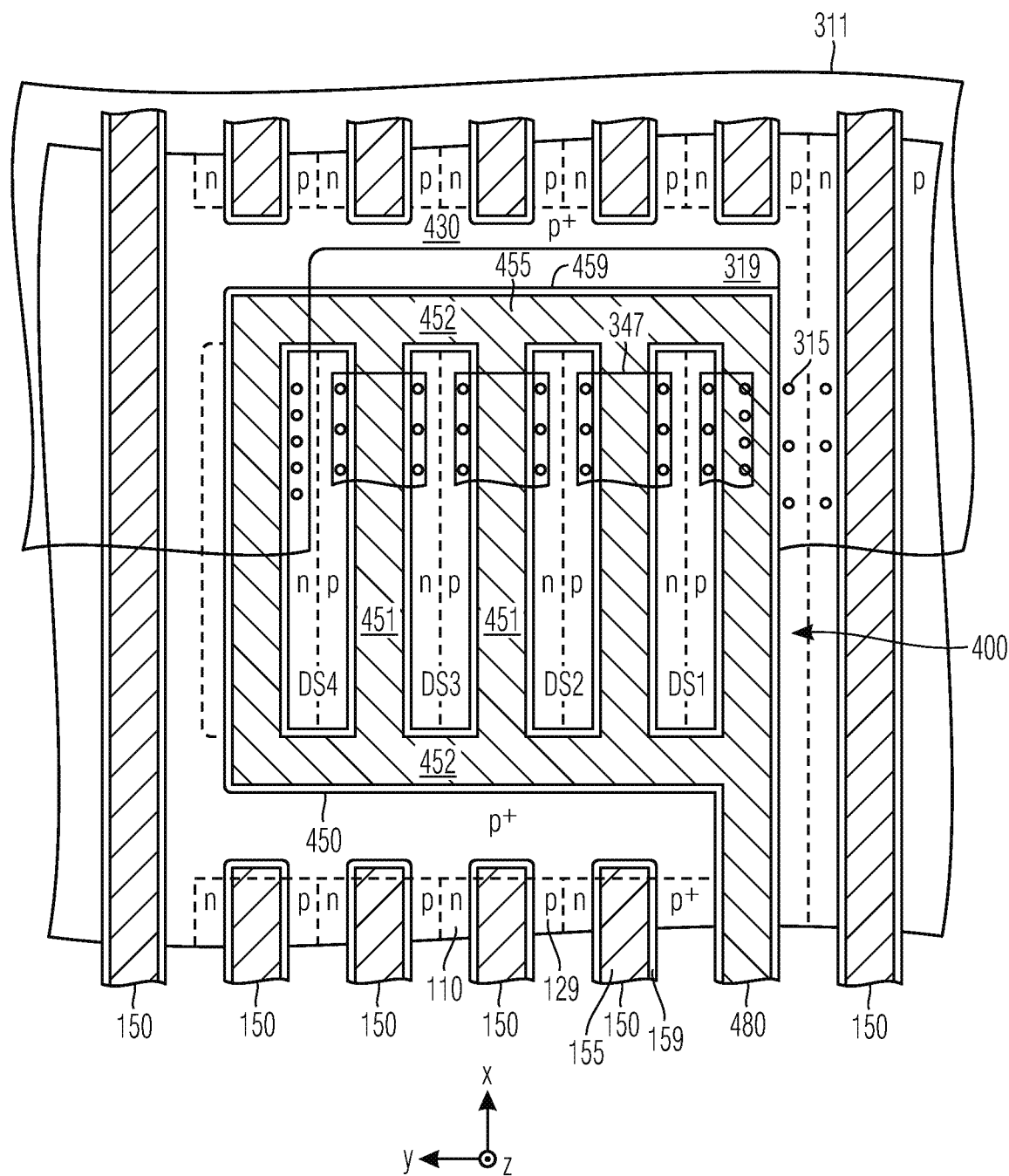
FIG. 13 shows a schematic plan view of a portion of a semiconductor device according to an embodiment with a sense element including pn junctions separated by frame trenches.

In the sense element 400 of FIG. 13, each diode structure DS1, DS2, DS3, DS4 is laterally completely surrounded by a frame trench structure that includes two first line portions 451 extending along the x-axis and two second line portions 452 extending along the y-axis. The two first line portions 451 run parallel to the trench gate structures 150 of the transistor cells TC. The first line portions 451 and the trench gate structures 150 may have the same dimensions and the same cross-sectional shape. The first line portions 451 may include a dielectric liner 459 having the same material configuration as the gate dielectric 159. The first line portions 451 may include a conductive portion 455 having the same material configuration as the gate electrode 155. The conductive portion 455 of the frame trench structure 450 and the gate electrode 155 are electrically separated and can be connected to different drivers supplying different signals.

The two second line portions 452 run orthogonal to the trench gate structures 150 of the transistor cells TC. The first line portions 451 and the second line portions 452 may have the same dimensions, the same cross-sectional shape and the same material configuration.

The first line portions 451 and the second line portions 425 of the diode structures DS1, DS2, DS3, DS4 form a ladder-like structure, wherein the second line portions 452 form the rails and the shared first line portions 451 form the rungs of the ladder. The conductive portion 455 in the merged frame trench structures is electrically connected with the conductive portion of the sense line 480.

Figure 14:
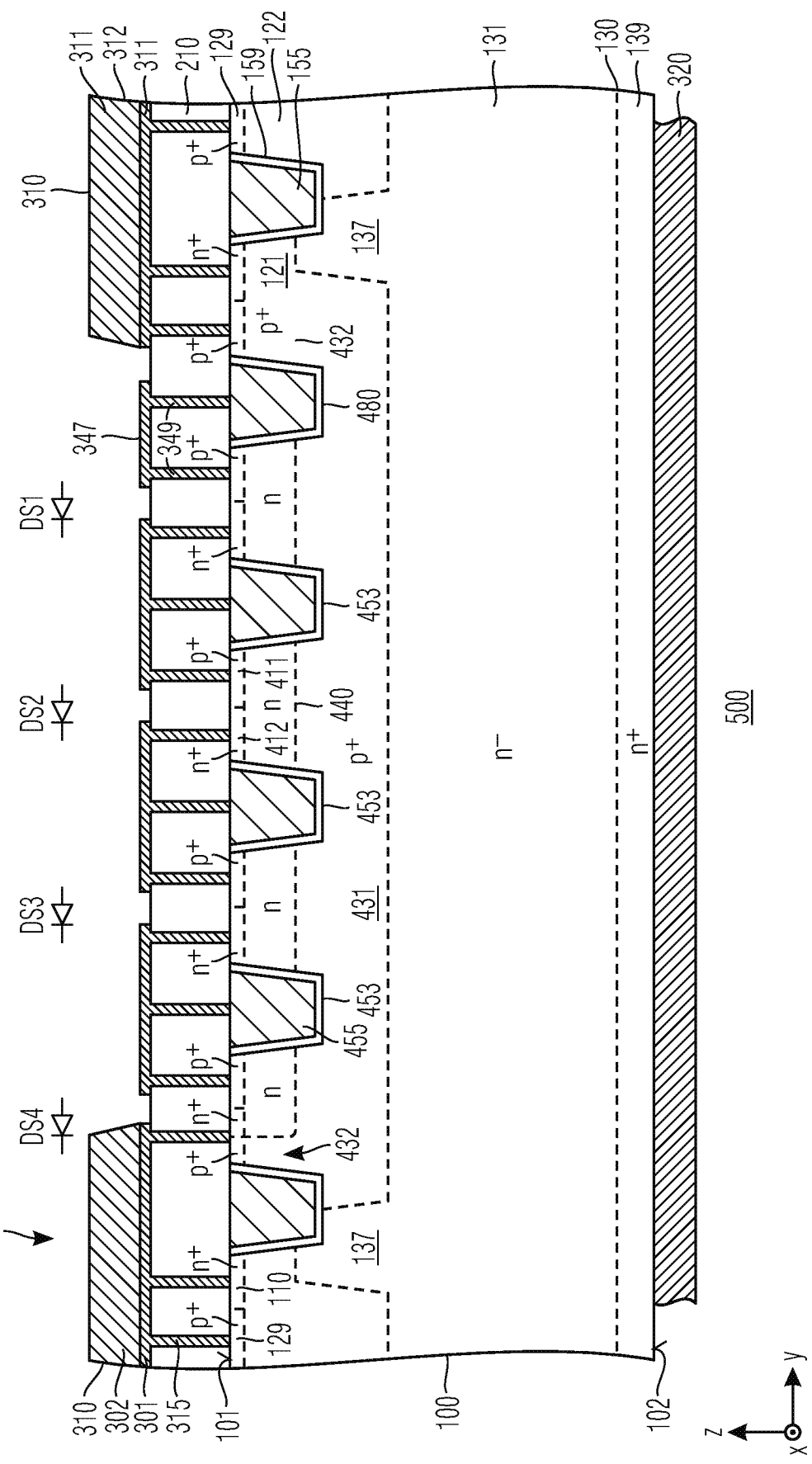
FIG. 14 shows a schematic vertical cross-sectional view of a portion of a semiconductor device according to an embodiment with wiring connections formed on an interlayer dielectric.

In FIG. 14 a vertical extension of separation trenches 453 as illustrated in FIG. 12 is greater than the distance of the horizontal junctions between the diode wells 440 and the isolation well 430 from the first surface 101. In other words, the separation trenches 453 extend through the bottom of the n-type diode wells 440 into the p-type isolation well 430.

The wiring connections 347 are formed from sections of a thin metallization layer 301. Wiring contact structures 349 extend from the wiring connections 347 through openings in the interlayer dielectric 210 to the cathode regions 412 and the anode regions 411 of the diode structures DS1, DS2, DS3, DS4 and to the conductive portions 455 of the inter- mediate separation trenches 453. Source contact structures 315 extend from the source electrode 310 through openings in the interlayer dielectric 210 to the source regions 110 and the body contact regions 129 of the transistor cells TC.

The wiring contact structures 349 and the source contact structures 315 may contain tungsten (W).

Figure 15:
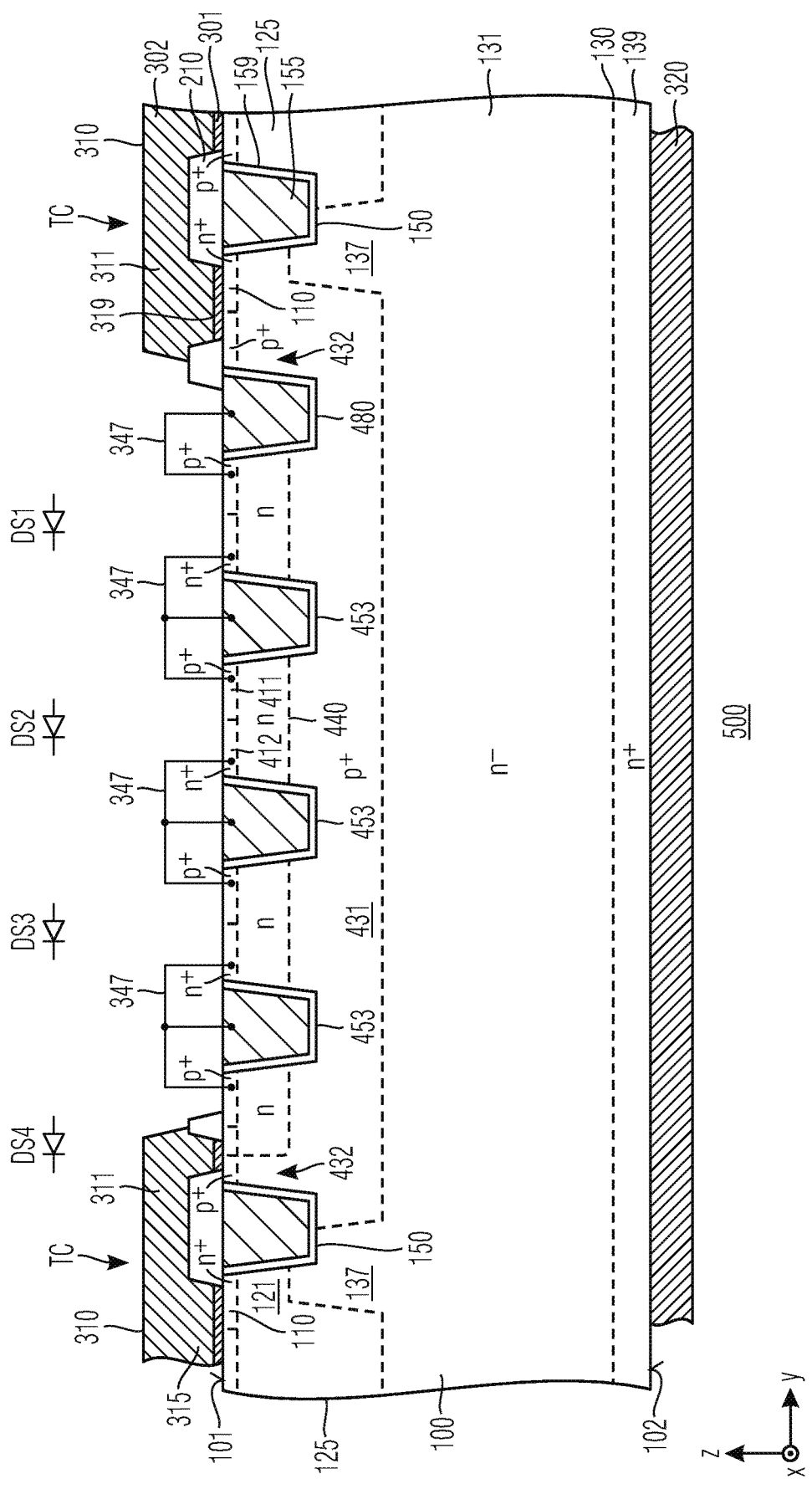
FIG. 15 shows a schematic vertical cross-sectional view of a portion of a semiconductor device according to an embodiment with wide source contact structures.

In FIG. 15, the thin metallization layer 301 includes one or more thin interface layers. The source contact structures 315 include sections of the thin metallization layer 301 along the first surface 101 and a fill portion formed from the material of the thick metallization layer 302.

The wiring connections 347 may include sections of the thin metallization layer 301 and a further conductive layer electrically connecting thin metallization layer sections on opposite sides of a separation trench 453 with each other and with the conductive portion of the intermediate separation trench 453.

Though the illustrated embodiments focus on transistor cells with trench gate structures, the sensor element and the sense pad according to the illustrated embodiments may be combined with transistor cells with planar gates as well.

Though the illustrated embodiments focus on transistor cells with one-sided transistor channel, the sensor element and the sense pad according to the illustrated embodiment can be combined with transistor cells with transistor channels on both sides as well.

Though the illustrated embodiments focus on semiconductor devices with vertical current flow, the sensor element and the sense pad according to the illustrated embodiment can be realized in semiconductor devices with horizontal current flow as well.

What is claimed is:

1. A semiconductor device, comprising:
    a transistor array comprising a plurality of transistor cells electrically connected in parallel between a source electrode and a drain structure, wherein the drain structure is formed in a semiconductor portion based on a wide bandgap material;
    at least one frame trench structure;
    a sense pad; and
    a sense element formed from the wide bandgap material, wherein the sense element includes at least one rectifying junction electrically connected between the sense pad and the source electrode,
    wherein the sense element comprises one or more diode structures,
    wherein each diode structure comprises a cathode region and a rectifying metal-semiconductor junction,
    wherein a semiconductor side of the rectifying metal-semiconductor junction is directly electrically connected with the cathode region,
    wherein each frame trench structure laterally surrounds one of the diode structures.

2. The semiconductor device of claim 1, wherein the sense element is laterally embedded in the transistor array.

3. The semiconductor device of claim 1, wherein the source electrode comprises a source pad, and wherein the source pad has an opening directly above the sense element.

4. The semiconductor device of claim 1, wherein the source electrode includes first sections of a thin layer metallization, and wherein wiring connections connecting neighboring ones of the diode structures comprise second sections of the thin layer metallization.

5. The semiconductor device of claim 4, wherein the wiring connections comprise a layer comprising tungsten.

6. The semiconductor device of claim 1, further comprising a buried sense line electrically connecting the sense element and the sense pad.

7. The semiconductor device of claim 6, wherein the transistor cells comprise stripe-shaped trench gate structures, and wherein the buried sense line and the trench gate structures run parallel to each other.

8. The semiconductor device of claim 7, wherein the stripe-shaped trench gate structures and the buried sense line have a same cross-sectional shape in a cross section orthogonal to a longitudinal extension.

9. A semiconductor device, comprising:
a transistor array comprising a plurality of transistor cells electrically connected in parallel between a source electrode and a drain structure, wherein the drain structure is formed in a semiconductor portion based on a wide bandgap material;
a sense pad; and
a sense element formed from the wide bandgap material, wherein the sense element includes at least one rectifying junction electrically connected between the sense pad and the source electrode,
wherein the sense element comprises one or more diode structures,
wherein each diode structure comprises a cathode region and a rectifying metal-semiconductor junction,
wherein a semiconductor side of the rectifying metal-semiconductor junction is directly electrically connected with the cathode region,
wherein the source electrode includes first sections of a thin layer metallization,
wherein wiring connections connecting neighboring ones of the diode structures comprise second sections of the thin layer metallization.

10. The semiconductor device of claim 9, wherein the wiring connections comprise a layer comprising tungsten.

11. A semiconductor device, comprising:
a transistor array comprising a plurality of transistor cells electrically connected in parallel between a source electrode and a drain structure, wherein the drain structure is formed in a semiconductor portion based on a wide bandgap material;
one or more separation trenches extending from a front side into the semiconductor portion;
a sense pad; and
a sense element formed from the wide bandgap material, wherein the sense element includes at least one rectifying junction electrically connected between the sense pad and the source electrode,
wherein the sense element comprises one or more diode structures,
wherein each diode structure comprises an anode region and a cathode region,
wherein the anode region and the cathode region of each diode structure form one of the rectifying junctions,
wherein each separation trench is formed between neighboring diode structures.

12. A semiconductor device, comprising:
a transistor array comprising a plurality of transistor cells electrically connected in parallel between a source electrode and a drain structure, wherein the drain structure is formed in a semiconductor portion based on a wide bandgap material;
an isolation well of a conductivity type opposite to a conductivity type of the drain structure;
a sense pad; and
a sense element formed from the wide bandgap material, wherein the sense element includes at least one rectifying junction electrically connected between the sense pad and the source electrode,
wherein the sense element comprises one or more diode structures,
wherein each diode structure comprises an anode region and a cathode region,
wherein the anode region and the cathode region of each diode structure form one of the rectifying junctions,
wherein the isolation well extends from a front side into the semiconductor portion,
wherein the one or more diode structures are formed in a part of the semiconductor portion enclosed by the isolation well.

13. The semiconductor device of claim 12, wherein the isolation well and the source electrode are connected through a low-conductive ohmic path.

14. The semiconductor device of claim 12, further comprising one or more separation columns of the conductivity type of the isolation well, wherein each separation column is formed between two neighboring diode structures.

15. The semiconductor device of claim 12, further comprising one or more diode wells of the conductivity type of the drain structure, wherein the one or more diode wells separate the isolation well and the anode regions from each other.

16. The semiconductor device of claim 12, further comprising one or more separation trenches extending from the front side into the semiconductor portion, wherein each separation trench is formed between neighboring diode structures.

17. The semiconductor device of claim 12, further comprising at least one frame trench structure, wherein each frame trench structure laterally surrounds one of the diode structures.

18. The semiconductor device of claim 12, wherein the source electrode includes first sections of a thin layer metallization, and wherein wiring connections connecting neighboring ones of the diode structures comprise second sections of the thin layer metallization.

19. The semiconductor device of claim 18, wherein the wiring connections comprise a layer comprising tungsten.

20. A semiconductor device, comprising:
a transistor array comprising a plurality of transistor cells electrically connected in parallel between a source electrode and a drain structure, wherein the drain structure is formed in a semiconductor portion based on a wide bandgap material;
a sense pad;
a sense element formed from the wide bandgap material, wherein the sense element includes at least one rectifying junction electrically connected between the sense pad and the source electrode; and
a buried sense line electrically connecting the sense element and the sense pad,
wherein the transistor cells comprise stripe-shaped trench gate structures,
wherein the buried sense line and the trench gate structures run parallel to each other.

21. The semiconductor device of claim 20, wherein the stripe-shaped trench gate structures and the buried sense line have a same cross-sectional shape in a cross section orthogonal to a longitudinal extension.

* * * * *